(12) United States Patent
Sercu et al.

(10) Patent No.: US 7,331,023 B2
(45) Date of Patent: Feb. 12, 2008

(54) MODELLING CURRENT FLOWS IN THREE-DIMENSIONAL CONDUCTIVE AND DIELECTRIC BODIES

(75) Inventors: Jeannick Sercu, Ghent (BE); Jan Van Hese, Ghent (BE); Daniel De Zutter, Eeklo (BE); Luc Knockaert, Ghent (BE)

(73) Assignee: Agilent Technologies, Inc., Santa Clara, CA (US)

( * ) Notice: Subject to any disclaimer, the term of this patent is extended or adjusted under 35 U.S.C. 154(b) by 403 days.

(21) Appl. No.: 11/069,545

(22) Filed: Mar. 1, 2005

(65) Prior Publication Data

US 2005/0198599 A1 Sep. 8, 2005

(51) Int. Cl.
*G06F 17/50* (2006.01)
(52) U.S. Cl. .................... 716/4; 716/3; 716/18; 703/2
(58) Field of Classification Search ............. 716/1–4, 716/18; 703/2
See application file for complete search history.

(56) References Cited

U.S. PATENT DOCUMENTS

| | | | |
|---|---|---|---|
| 5,751,591 A | 5/1998 | Asada | |
| 5,751,600 A * | 5/1998 | Ochi et al. | 702/64 |
| 6,066,598 A * | 5/2000 | Ishikawa et al. | 505/210 |
| 6,330,704 B1 | 12/2001 | Ljung et al. | |
| 6,456,861 B1 * | 9/2002 | Hidaka et al. | 505/210 |
| 6,456,949 B1 * | 9/2002 | Yamagajo et al. | 702/65 |
| 7,068,518 B2 * | 6/2006 | Ueno et al. | 361/760 |
| 2003/0072130 A1 | 4/2003 | Tsang et al. | |

FOREIGN PATENT DOCUMENTS

WO  WO 97/20276  6/1997

OTHER PUBLICATIONS

Song et al., A new surface integral formulation for wideband impedance extraction of 3-D structure, 2003, ACM, pp. 843-847.*
Trabelsi et al., global electromagnetic analysis of microware circuits including lumped element based on interaction medhod, 2003, IEEE, pp. 742-745.*
EP Search Report, Jun. 30, 2004.
R. Horton et al, "Variations of microstrip losses with thickness of strip", Electronics Letters, vol. 7, No. 17, pp. 490-491, Aug. 1971.
J. Sercu et al, "Mixed Potential Integral Equation Technique for Hybrid Microstrip-Slotline Multilayered Circuits using a Mixed Rectangular-Triangular Mesh", IEEE Transactions on Microwave Theory and Techniques, pp. 1162-1172, May 1995.
J. C. Rautio et al, "Microstrip conductor loss models for electromagnetic analysis", IEEE Transactions on Microwave Theory and Techniques, vol. 51, No. 3, pp. 915-921, Mar. 2003.
A.J. Poggio et al, "Integral Equation Solutions of Three Dimensional Scattering Problems", Computer techniques for electromagnetics, R. Mittra, Pergamon Press, Oxford, 1973 (extracts).
R. E. Collin, "Field theory of guided waves", IEEE Press Series on Electromagnetic Waves, 1990: section 1.8 "Some Field Equivalence Principles", pp. 34-44.

* cited by examiner

*Primary Examiner*—Jack Chiang
*Assistant Examiner*—Nghia M. Doan

(57) ABSTRACT

Current flows in a three-dimensional conductive or dielectric body embedded in a substrate of a different material are modelled in terms of surface currents induced in planar surfaces bounding the body and composed of the same material as the substrate, the surfaces having appropriate values for surface impedance.

8 Claims, 11 Drawing Sheets

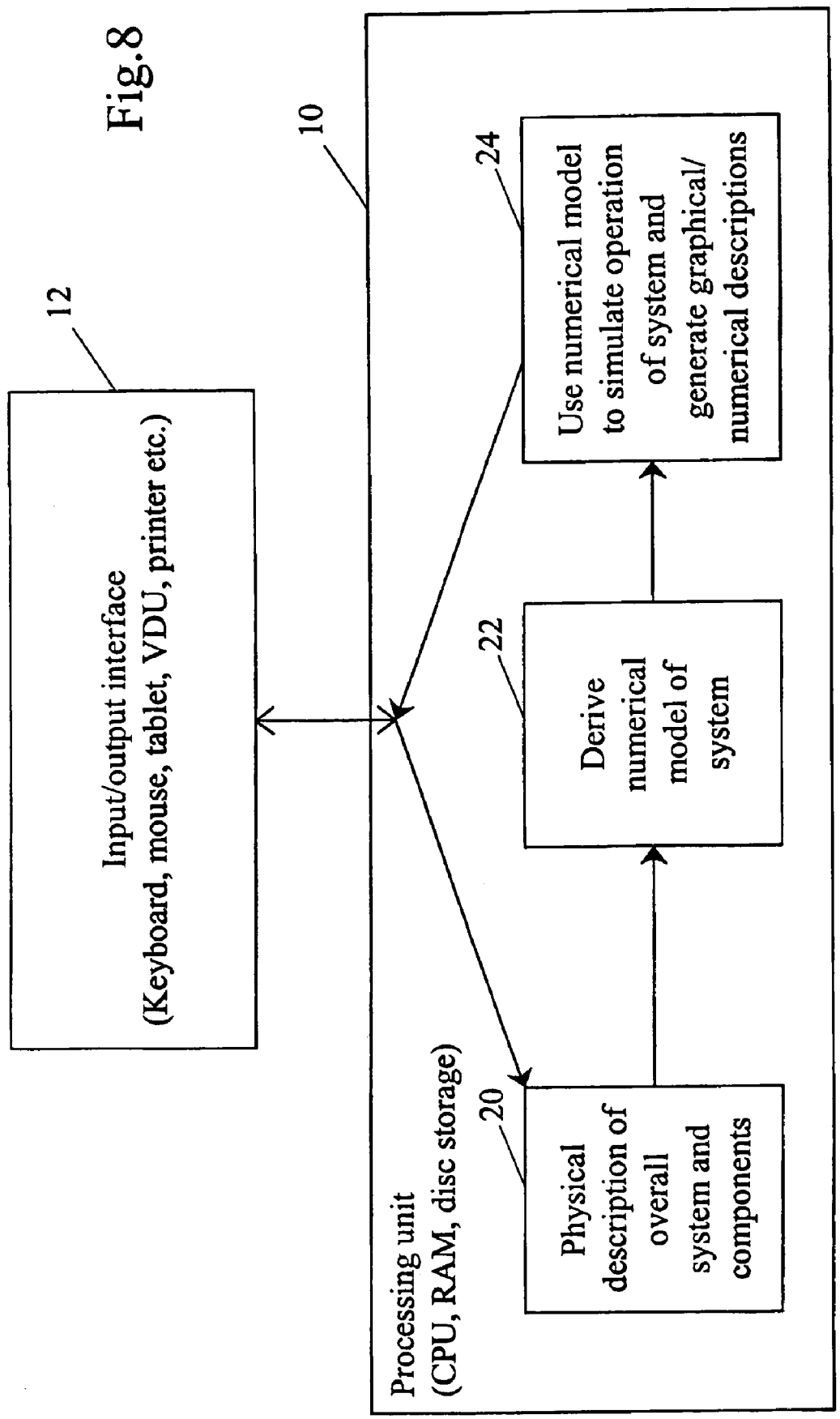

MODELLING CURRENT FLOWS IN THREE-DIMENSIONAL CONDUCTIVE AND DIELECTRIC BODIES

This application claims priority from United Kingdom Patent Application No. 0404624.9, filed on 24 Mar. 2004, which is incorporated by reference in its entirety.

This invention relates to methods and apparatus for modelling current flows in three-dimensional conductive and dielectric bodies, for example finite thickness conductors in planar electromagnetic circuit simulations.

BACKGROUND ART

Planar electromagnetic (EM) simulation technology enables, in generalised terms, the modelling of three-dimensional electromagnetic fields excited by currents flowing in planar conductors embedded in a multilayered dielectric medium. In this technology, planar conductors that are actually three-dimensional (i.e. have a thickness that is not negligible in terms of circuit operation relative to their width) are approximated as zero thickness sheet conductors. These conductors are treated as being printed on or embedded in a stratified dielectric layer stack (also called the substrate), and as only supporting planar (two-dimensional) surface currents $J_s(r)$ that flow in the metal sheets on either horizontal or vertical planes. FIG. 1 shows a generalised planar metallization pattern (e.g. a printed circuit track or microstrip) embedded in a generalised multilayered dielectric medium (e.g. part of a multilayered printed circuit board).

In real circuits, conductors always have a finite thickness. However, for many practical RF and microwave planar structures found in monolithic microwave integrated circuits (MICs), RF boards, RF modules and planar antenna applications the metal thickness is typically much smaller than the width of the metal traces. In these cases the zero thickness model used in planar EM technology can be applied and yields valid simulation results. Moreover, in this approach the finite thickness of the conductors is not totally neglected but is taken into account through the concept of surface impedance, as described subsequently.

When considering the current distribution in the cross section of a 3D planar conductor with width w, thickness t and conductivity $\sigma$ (see FIG. 2), and hence the conductor loss as a function of frequency, three frequency ranges can be distinguished (assuming that w>t), each exhibiting its own loss characteristic. At low frequencies, with skin depth large compared to width w and thickness t, the current is uniformly distributed through the cross section of the conductor and the loss is determined by the DC resistance $R_{DC} \propto 1/\sigma wt$. At higher frequencies the edge effect starts to manifest itself, that is, internal inductive effects tend to modify the current distribution into an exponential regime, with an increased current density at the outer edges and a decreased current density at the centre of the conductor. This so-called edge singularity effect of the current distribution increases the loss in the conductor and starts to play a role for frequencies where the width of the conductor becomes larger than twice the skin depth (w>2$\delta_s$). The skin depth is defined as the depth inside the conductor at which the current density has reduced by a factor of e.

At even higher frequencies, when the conductor becomes thick compared to the skin depth (t>$\delta_s$), loss increases even more because the current is increasingly confined to the surface of the conductor. This is the so-called skin-effect region in which the classic dependence of loss on the square-root of frequency occurs. For a conductor in proximity to the groundplane the current distribution is more confined to the bottom layer of the conductor, hence the skin effect is dominantly single-sided. For isolated conductors the skin effect is double-sided, i.e. the current is equally distributed and confined to both the bottom and top layers of the conductor.

In planar electromagnetic simulation the skin effect is taken into account by applying the surface impedance concept, while the edge effect is taken into account by applying the concept of an edge mesh.

The surface impedance concept is used to include resistive losses and the frequency-dependent skin effect of currents in the planar conductor modelling process. This concept is based on the decomposition of the field problem into an internal and an external field problem. The internal field problem addresses the field problem inside the conductor and yields the surface impedance relation $$u_n \times E(r) = Z_s(u_n \times J_s(r)) \tag{1}$$

between the tangential electric field at each point of the metal surface and the equivalent surface current at the same point. In the external field problem, the thick conductor is replaced by a sheet (zero-thickness) conductor supporting the single surface current $J_s(r)$ (FIG. 3) related to the tangential electric field according to expression (1).

In expression (1) E(r) is the total electric field, $u_n$ is the unit vector normal to the surface of the conductor, and $Z_s$ is the frequency-dependent surface impedance of the conductor. The replacing sheet conductor is assumed to be infinitely thin and the actual thickness t and conductivity $\sigma$ of the thick conductor is accounted for by the surface impedance $Z_s$.

The Internal Field Problem

In planar EM technology two models for the surface impedance are most often used. These models are derived from the one-dimensional internal field problem associated with a finite thickness conductor plate with infinite lateral dimensions—see "Variations of microstrip losses with thickness of strip", R. Horton, B. Easter & A. Gopinath, *Electronics Letters*, vol. 7, no 17, pp. 490-491, August 1971. Owing to the one-dimensional nature of the field problem, Maxwell's equation can be solved analytically yielding a closed form expression for the surface impedance. Both models yield the same and correct DC resistance of the 3D conductor but differ in the high frequency limit. The first model describes a single-sided skin effect in which all the high frequency current is confined to a single skin depth layer. In practice this situation occurs for microstrip type structures close to a groundplane such that the proximity effect of the return current in the groundplane plays an important role in the current distribution. The second model describes the double-sided skin effect in which the high frequency current is distributed over two skin depth layers, one at the top and one at the bottom of the conductor. This is the case for stripline types of structures and for microstrip types of structures where the groundplane is far enough away, such that it has no significant effect on the current distribution inside the conductor.

Single-Sided Skin Effect Model

The model for the surface impedance that describes the single-sided skin effect is given by the formula:

$$Z_s(t, \sigma, \omega) = Z_c \coth(jk_c t) \text{ with} \tag{2}$$

$$Z_c = \sqrt{\frac{j\omega\mu}{\sigma + j\omega\varepsilon}}$$

$$jk_c = \sqrt{j\omega\mu(\sigma + j\omega\varepsilon)}$$

For low frequencies $\omega \to 0$ and by applying the limit $\coth(z) \to 1/z + z/3$, formula (2) is easily simplified to (3a), yielding the known DC resistance for a uniform current distribution in the entire cross section of a thick conductor with conductivity σ and thickness t:

$$Z_s(t, \sigma, \omega) \to \frac{1}{\sigma t} + j\omega \frac{\mu t}{3} \text{ for } \omega \to 0 \quad (3a)$$

Note that the surface impedance (3a) also models the increased internal inductance of the single layer surface current. For a good conductor with σ>>ωε and for high frequencies where the skin depth $\delta_s$ is much smaller than the conductor thickness t, the limit coth(z)→1 can be applied and formula (2) is reduced to (3b), describing the known skin effect behaviour of the current distribution causing the resistance to increase and the inductance to decrease with the square root of the frequency:

$$Z_s(t, \sigma, \omega) \to \frac{1}{\sigma \delta_s}(1+j) \text{ with } \delta_s = \sqrt{\frac{2}{\omega \mu \sigma}} \quad (3b)$$

The conductor loss modelled by the surface impedance formula (2) is equivalent to the loss for a uniform current distribution over the entire cross section (thickness t) at low frequencies and for a concentrated current distribution over a thickness $\delta_s$ at high frequencies. This equivalent surface impedance yields the exact solution at low frequencies. However, at high frequencies the model only provides good results when applied for good conductors, much wider than their thickness (typically w/t>5) and in proximity to the groundplane, so that the HF currents are flowing on one side of the conductor.

Double-Sided Skin Effect Model

The model for the surface impedance that describes the double-sided skin effect is given by the formula:

$$Z_s(t, \sigma, \omega) = \frac{1}{2} Z_c \coth\left(jk_c \frac{1}{2}\right) \text{ with} \quad (4)$$

$$Z_c = \sqrt{\frac{j\omega \mu}{\sigma + j\omega \varepsilon}}$$

$$jk_c = \sqrt{j\omega \mu (\sigma + j\omega \varepsilon)}$$

In the low frequency limit for ω→0 the known DC resistance for a uniform current distribution is recovered:

$$Z_s(t, \sigma, \omega) \to \frac{1}{\sigma t} + j\omega \frac{\mu t}{12} \text{ for } \omega \to 0 \quad (5)$$

In the high frequency limit where the skin depth $\delta_s$ is much smaller than the conductor thickness t, the limit coth(z)→1 can be applied and formula (4) is reduced to the following, describing the double-sided skin effect behaviour of the current distribution:

$$Z_s(t, \sigma, \omega) \to \frac{1}{2\sigma \delta_s}(1+j) \text{ with } \delta_s = \sqrt{\frac{2}{\omega \mu \sigma}} \quad (6)$$

The conductor loss modelled by the surface impedance formula (4) is equivalent to the loss of a uniform current distribution over the entire cross section (thickness t) at low frequencies, and of a double-layered current distribution over a thickness $\delta_s$ at high frequencies. This equivalent surface impedance yields the exact solution at low frequencies. However, at high frequencies the model only provides good results when applied for isolated good conductors, much wider than their thickness, so that the HF currents are evenly distributed and flowing both at the top and bottom sides of the conductor.

The External Field Problem

A basic integral equation in the unknown surface currents can be obtained by applying the surface impedance relation (1) above at the boundaries of the sheet conductors. By means of Green's theorem, the surface current contribution to the electric field is described by a surface integral representation in which the electric Green's dyadic of the substrate layer stack acts as the integral kernel. In the mixed potential integral equation (MPIE) formulation described in "Mixed Potential Integral Equation Technique for Hybrid Microstrip-Slotline Multilayered Circuits using a Mixed Rectangular-Triangular Mesh" by J. Sercu, N. Fache, F. Libbrecht & P. Lagasse, *IEEE Transactions on Microwave Theory and Techniques*, pp 1162-1172, May 1995, the electric field is decomposed into a contribution from the vector potential A(r) and a contribution from the scalar potential V(r):

$$E[J_s] = -j\omega A[J_s] - \nabla V[q_s] \text{ with} \quad (7)$$

$$A[J_s] = \iint_S dS' \overline{\overline{G}}^A(r, r') \cdot J_s(r')$$

$$V[q_s] = \iint_S dS' G^V(r, r') q_s(r')$$

$$= -\frac{1}{j\omega} \iint_S dS' G^V(r, r') \nabla'_s \cdot J_s(r')$$

In expression (7) $\overline{\overline{G}}^A$ is the dyadic magnetic Green's function and $G^V$ is the scalar electric Green's function of the multi-layered medium. The scalar potential originates from the dynamic surface charge distribution $q_s$ derived from the surface current through the current continuity relation and is related to the vector potential through the Lorentz gauge.

The electric field in expression (1) is the total electric field. By splitting the total electric field into an incoming field $E^{in}$ from the applied sources and a scattered field excited by the unknown surface currents, and by applying the mixed-potential decomposition (7) for the scattered field, the known mixed potential integral equation (MPIE) in the unknown surface currents is obtained:

$$E_t^{in}(r) = j\omega A_t[J_s(r)] + \nabla_t V[q_s(r)] + Z_s J_s(r) \quad (8)$$

Here the subscript "t" for the vectors denotes the vector component tangential to the surface S of the planar conductors.

The method of moments (MoM) solution process is used to discretise and solve the mixed potential integral equation (8). The MoM process is a numerical discretisation technique which builds a discrete approximation for the unknown surface current $J_s(r)$. This is accomplished by superimposing a notional mesh over the sheet conductor surface using rectangular and triangular cells, as shown schematically in FIG. 4. A finite number N of sub-sectional basis functions $B_1(r), \ldots, B_N(r)$ are defined over the mesh. They construct the basis of the discrete space within which the unknown surface current is approximated:

$$J_s(r) = \sum_{j=1}^{N} I_j B_j(r) \quad (9)$$

The standard basis functions used in planar EM simulators are the sub-sectional "rooftop" functions defined over the rectangular and triangular cells. Each rooftop is associated with one edge of the mesh and represents a current with constant density flowing through that edge, as shown in FIG. 4. The unknown amplitudes $I_j$, $j=1, \ldots, N$ of the basis functions determine the currents flowing through all the edges of the mesh.

The integral equation (8) is discretised by inserting the rooftop expansion (9) of the surface currents and by applying the Galerkin testing procedure. That is, by testing the integral equation using test functions identical to the basis functions, the continuous integral equation is transformed into a discrete matrix equation:

$$\sum_{j=1}^{N} Z_{i,j} I_j = V_i^{in} \text{ or } [Z] \cdot [I] = [V^{in}] \quad (10)$$

with $$Z_{i,j} = \langle B_i, j\omega A_t[B_j] + \nabla_t V[B_j] + Z_s B_j \rangle V_i^{in} = \langle B_i, E_s^{in} \rangle \quad (11)$$

Here $\langle \cdot, \cdot \rangle$ represents the Galerkin test operator. The left-hand-side matrix [Z] is called the interaction matrix as each element in this matrix describes the electromagnetic interaction between two rooftop basis functions. The dimension N of [Z] is equal to the number of basis functions. The right-hand-side vector $[V^{in}]$ represents the discretised contribution of the incoming fields generated by the sources applied at the ports of the sheet conductor. It is convenient to split the interaction elements into three parts associated with the magnetic vector potential, the electric scalar potential and the surface impedance. Thus:

$$Z_{i,j} = Z_{i,j}^L + Z_{i,j}^C + Z_{i,j}^R \quad (12a)$$

with $$Z_{i,j}^L = \langle B_i, j\omega A_s[B_j] \rangle$$

$$Z_{i,j}^C = \langle B_i, \nabla_s V[B_j] \rangle$$

$$Z_{i,j}^R = \langle B_i, Z_s B_j \rangle \quad (12b)$$

The use of the mixed potential formulation in combination with the surface impedance concept enables decomposition of each interaction element $Z_{i,j}$ into an inductive term, a capacitive term and a resistive term. The inductive and capacitive interaction terms are each defined by a quadruple integral, in which the Green's functions act as integral kernels (12a); the resistive term is defined by the overlap integral of two basis functions:

$$Z_{i,j}^L = j\omega \iint_S dS B_i(r) \cdot \iint_S dS' \overline{\overline{G}}^A(r, r') \cdot B_j(r') \quad (13)$$

$$Z_{i,j}^C = \frac{1}{j\omega} \iint_S dS \nabla_s \cdot B_i(r) \iint_S dS' G^V(r, r') \nabla_s' \cdot B_j(r')$$

$$Z_{i,j}^R = Z_s \iint_S dS B_i(r) \cdot B_j(r)$$

Implementation of the method of moments (MoM) solution process in a practical simulation consists of two major steps: loading the matrix and solving the matrix. The loading step comprises the computation of all the electromagnetic interactions between each pair of basis functions according to expressions (12a) and (12b). This involves the computation of the quadruple integrals as defined in expression (13). The computed interaction elements are stored in the interaction matrix. It is important to note that the interaction matrix as defined in the rooftop basis is a dense matrix, i.e. each rooftop function interacts with each other rooftop function. The matrix loading process is essentially a process of order $N^2$, i.e. the computation time goes up with the square of the number of unknowns.

In the solving step the matrix equation (10) is solved for the unknown current expansion coefficients. The solution yields the amplitudes $I_j$, $j=1, \ldots, N$ of the rooftop basis functions which span the surface current flowing in the zero-thickness sheet conductors. Once the currents are known, the field problem is solved because all physical quantities can be expressed in terms of the currents.

Modelling of Thick Conductors

The representation of metal conductors in current planar EM technology involves certain specific approaches:

Present planar EM technology uses the concept of infinitely thin conductors. In reality this means that the thickness of the conductor should be substantially smaller than its width.

The effect of the finite thickness is accounted for by introducing the surface impedance concept ($Z_s$).

The above treatment of metal conductors turns out to be appropriate for classical microwave circuits (e.g. filters, antennas) and in many cases also for RF and digital boards.

However, prediction of the circuit behaviour based on Maxwell's equations (and hence taking into account all effects such as capacitive and inductive crosstalk, reflection, ringing, . . . ) is no longer the sole interest of microwave and digital circuit and board designers. New and more advanced consumer devices such as GPS systems, third-generation mobile phones and game consoles, increasing demands for processing power and communication bandwidth, exchange and transport of large amounts of data (e.g. on the internet, on LAN's, WLAN's etc.), and ever more powerful computers all rely on advanced semiconductor integrated circuit (IC) technologies. The International Roadmap for Semiconductors (ITRS) predicts that the smallest IC features will shrink from 150 nm in 2002 to 50 nm by 2012, while the clock speed will increase from 1.5 GHz to 10 GHz. At the same time the importance of the interconnect (metal conductor) part of the chip will grow. In a typical advanced microprocessor, for example, total interconnection length will increase from about 2 km to about 24 km by 2012. This interconnection length also includes on-chip passive components such as capacitors and inductors.

It is quite clear that the infinitely-thin conductor approximation is not justified for on-chip interconnections. The width and thickness of the conductors is typically of the same magnitude e.g. a 1 μm by 1 μm cross-section, and the spacing between conductors is of that same order. The on-chip conductor geometry will have an impact on how the capacitive and inductive coupling between conductors should be handled. Particular attention will also have to be devoted to the resistance of the conductor. For digital signals, frequencies from DC to about 50 GHz (i.e. ten harmonics when a maximum clock rate of 10 GHz is considered) will have to be taken into account. The current distribution inside the conductor will evolve from the quasi-static case (DC resistance) to the high-frequency case (presence of skin effect and losses dominated by the surface impedance).

All these considerations lead to the conclusion that the infinitely-thin conductor approximation is no longer valid and improved modelling of the conductors is required.

Several proposals exist for incorporating homogeneous 3D conductors into an EM simulator. The most straightforward solution is to use a rigorous 3D field simulator. Such simulators are capable of handling general 3D conductor objects. However, when applied to 3D planar conductors embedded in a multilayered medium they become numerically very intensive (the discretisation size inside the conductor must typically be smaller than the skin depth) and not practical for real-life structures.

There are approaches based on the one-layer sheet conductor approximation (shown in FIG. 5(b)) and the use of either the single-sided or the double-sided model for the scalar surface impedance. A disadvantage of this approach is that these models are only valid for good conductors which are much wider than their thickness (typically w/t>5). At high frequencies both models neglect the currents on the side walls and assume a predefined distribution of the current on the top and bottom layers of the conductor. These assumptions usually lead to an overestimation of the high frequency loss. Also, with a single-layer surface current, the thickness dependency of the external inductance is neglected, so the inductance is also overestimated.

An improved high-frequency model for a thick conductor is obtained by using the two-layer sheet conductor model, shown in FIG. 6(b). In this two-layer model the volume of the conductor is divided into two equal sheet conductor layers, one at the top surface and the other at the bottom surface of the conductor. The frequency-dependent skin effect in each sheet conductor is included by using the single-sided surface impedance model (expression (2)) with a thickness equal to one half of the total conductor thickness. In this model the distribution of the current flow between the top and the bottom layer is not predefined and will follow from the solution of the EM equations, yielding an improved model for the high frequency losses. With the two-layer surface current the thickness dependency of the external inductance is included. The surface impedances used for the top and bottom layer are however uncoupled and do not account for the mutual internal inductance. Hence the two-layer surface impedance model tends to overestimate the global inductance. More details of the two-layer sheet conductor model are given in "Microstrip conductor loss models for electromagnetic analysis", J. C. Rautio & V. Demir, *IEEE Transactions on Microwave Theory and Techniques*, vol. 51, no. 3, pp. 915-921, March 2003.

Other approaches are capable of handling the problem in an exact way. As already outlined above, planar EM solvers approximate the problem by introducing a scalar surface impedance that becomes inaccurate for thick conductors and is not suited for dielectrics. To handle the problem in an exact way, a typical approach described in the literature is first to solve a boundary integral equation for the fields inside the conductor, yielding a relationship between the tangential electric and magnetic fields at the boundary surface between the conductor and its surrounding layer. Next the process is repeated for the fields outside the conductor (i.e. in the layered background medium). Again a relationship is obtained between the tangential fields. Finally, by demanding the tangential field components be continuous across the boundary surface, a set of integral equations is obtained for these tangential fields. A well-known set of integral equations that are particularly suited to handle this type of problem are those known as the Poggio and Miller integral equations, described in "Integral Equation Solutions of Three Dimensional Scattering Problems" by A. J. Poggio and E. K. Miller, *Computer techniques for electromagnetics*, R. Mittra, Pergamon Press, Oxford, 1973. The problem can also be reformulated in terms of equivalent electric and magnetic currents residing on the boundary surface—see for example the discussion on field equivalence in "Field theory of guided waves", R. E. Collin, *IEEE Press Series on Electromagnetic Waves*, 1990. This approach has two major disadvantages when used in conjunction with a planar EM solver:

The need to introduce both equivalent electric and magnetic surface currents doubles the number of unknowns that have to be handled by the solver as compared to the case where only electric surface currents are needed.

Present planar solver technology is inherently based on the concept that a conductor surface is modelled by electric surface currents alone. The Green's functions used in the solver calculate the electric field associated with these currents, at the same time crucially ensuring that the tangential magnetic field satisfies the correct jump condition at the current layer (see FIG. 7): $u_n \times H_1 - u_n \times H_2 = J_s$. The tangential electric field remains continuous, i.e. $u_n \times E_1 = u_n \times E_2$. The magnetic field itself is never calculated. In order to apply the approach explained above, it would become necessary to know these magnetic fields as well (and hence the curl of the magnetic vector potential).

DISCLOSURE OF INVENTION

According to one aspect of this invention there is provided a method of modelling current flows in a three-dimensional body embedded in a medium composed of a first material, the body being composed of a second material, comprising:

defining a plurality of planar surfaces that together bound the body;

deriving a value for surface impedance or surface admittance of the plurality of planar surfaces; and modelling current flows in the body in terms of surface currents induced on the planar surfaces of a body composed of the first material and having the derived value for surface impedance or surface admittance.

According to another aspect of this invention there is provided apparatus for modelling current flows in a three-dimensional body embedded in a medium composed of a first material, the body being composed of a second material, comprising:

a store arranged to hold data defining a plurality of planar surfaces that together bound the body; and a processor arranged to derive a value for surface impedance or surface admittance of the plurality of planar surfaces, and to model current flows in the body in terms of surface currents induced on the planar surfaces of a body composed of the first material and having the derived value for surface impedance or surface admittance.

The invention does not suffer from the drawbacks discussed above. Only a notional electric surface current is introduced—no magnetic current is needed. The Green's functions remain unchanged as do the jump condition at the surface current ($u_n \times H_1 - u_n \times H_2 = J_s$ and $u_n \times E_1 = u_n \times E_2$). The complete physics can be captured by the introduction of a surface impedance operator (or equivalently a surface admittance operator), so no extra unknowns are introduced. Only the relationship between electric field and current becomes more complex, i.e. no longer scalar but instead given by a matrix. Extra computational effort is needed to determine this surface impedance matrix, but this additional computation is much less than that required by alternative approaches because it can be accomplished by re-use of part of the computational effort needed to load matrices of the external field problem part of the planar EM solver technique.

The invention can be used not only for finite conductors but also to handle the presence of finite dielectrics. An advantage of the invention is that it also restores the planar stratified nature of the background medium, such that the Green's functions $G^A(r,r')$ and $G^V(r,r')$ can still be used without modification.

BRIEF DESCRIPTION OF DRAWINGS

A method and apparatus in accordance with this invention, for modelling current flows in three-dimensional conductive or dielectric bodies, will now be described, by way of example, with reference to the accompanying drawings, in which:

FIG. 8 is a block diagram of apparatus for simulating operation of a circuit including three-dimensional conductors;

DETAILED DESCRIPTION

Figure 1:
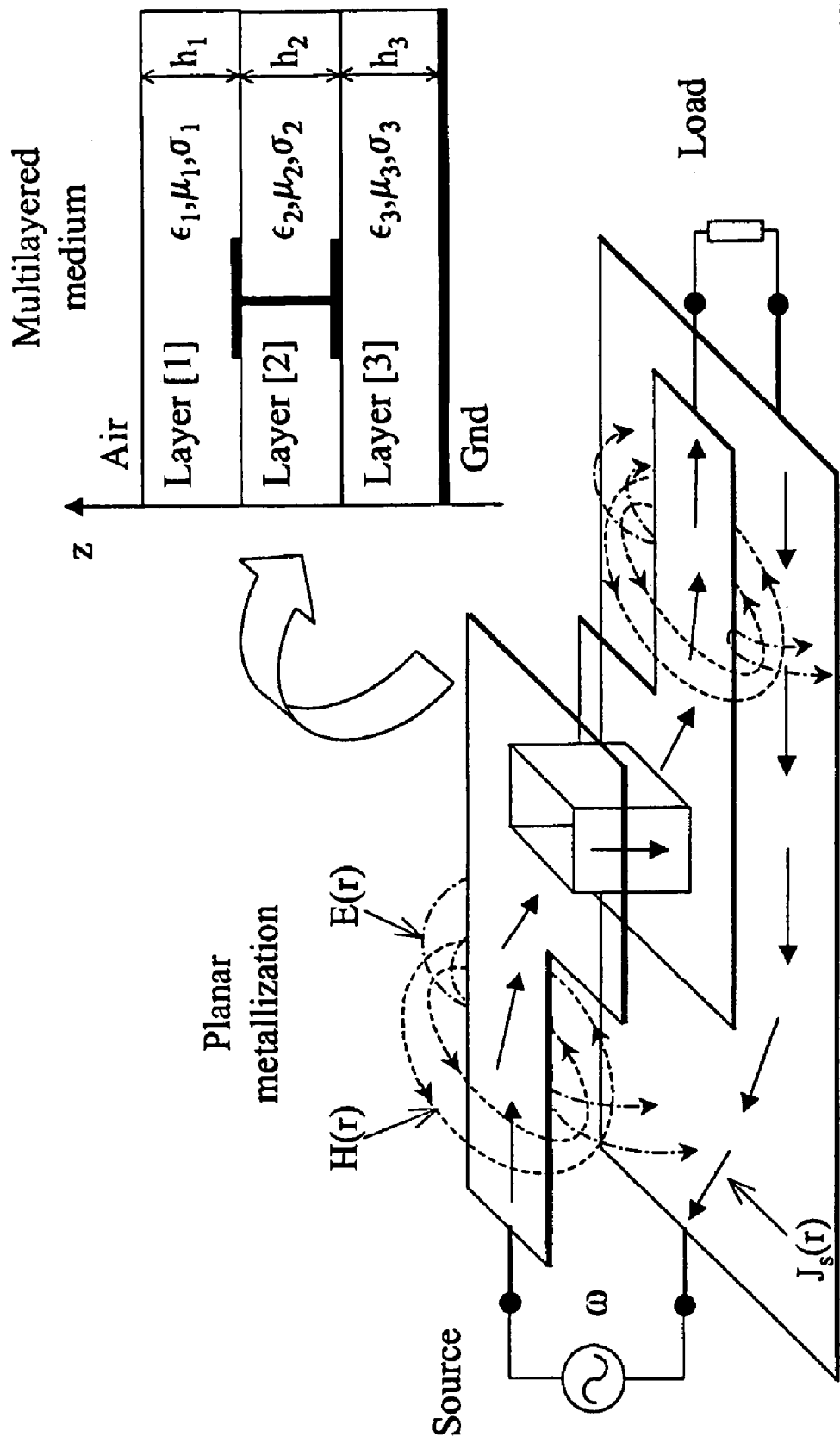
FIG. 1 is a schematic representation of horizontal and vertical surface currents on zero thickness planar metallizations embedded in a multilayered dielectric medium.
Figure 2:
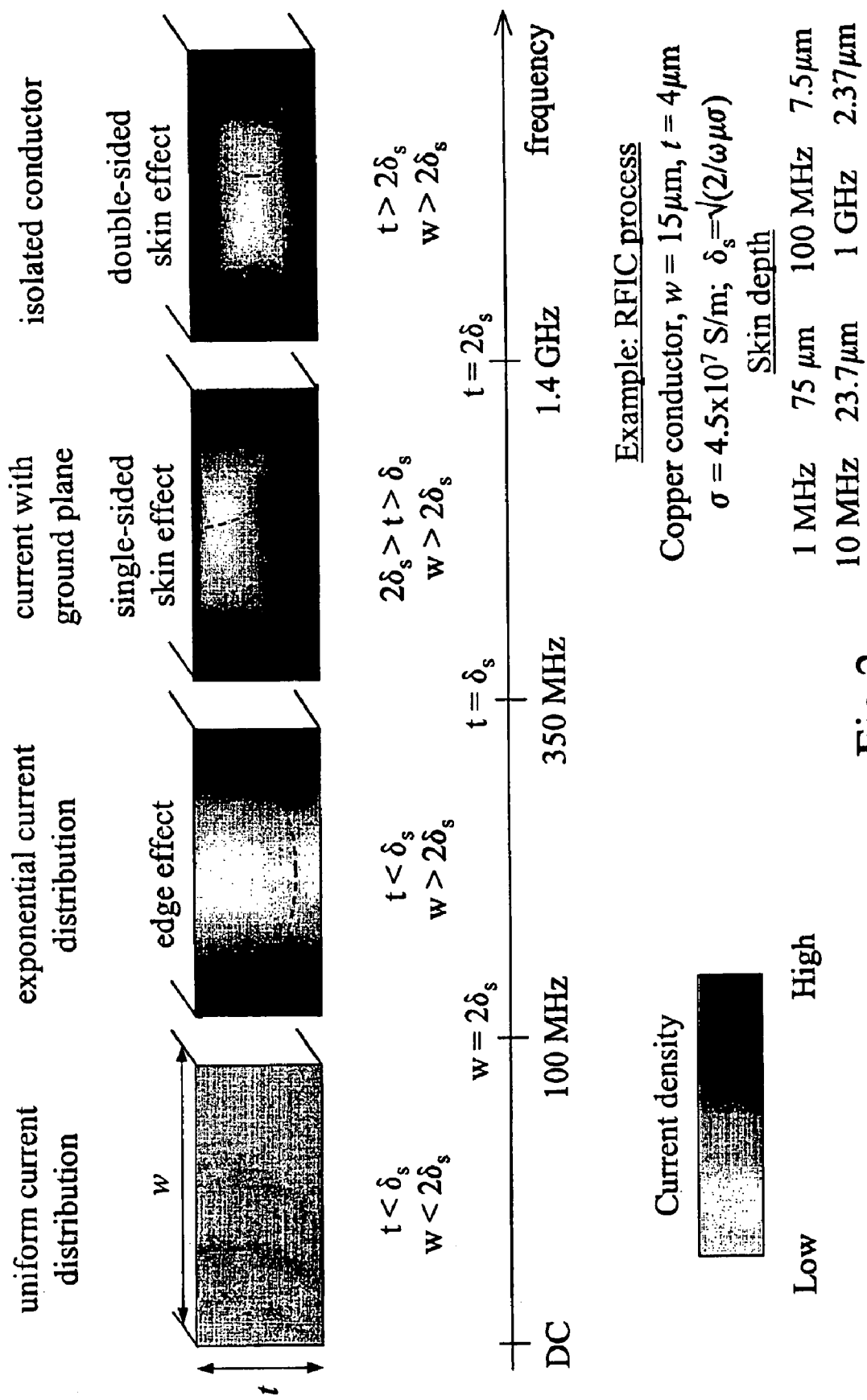
FIG. 2 illustrates current distribution in the cross section of a 3D planar conductor as a function of frequency.
Figure 3:
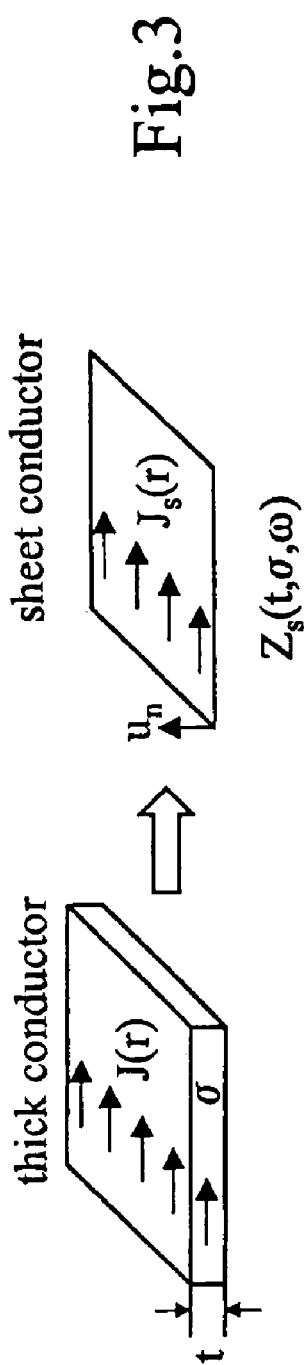
FIG. 3 illustrates the surface impedance concept for modelling conductor loss and skin effect.
Figure 4:
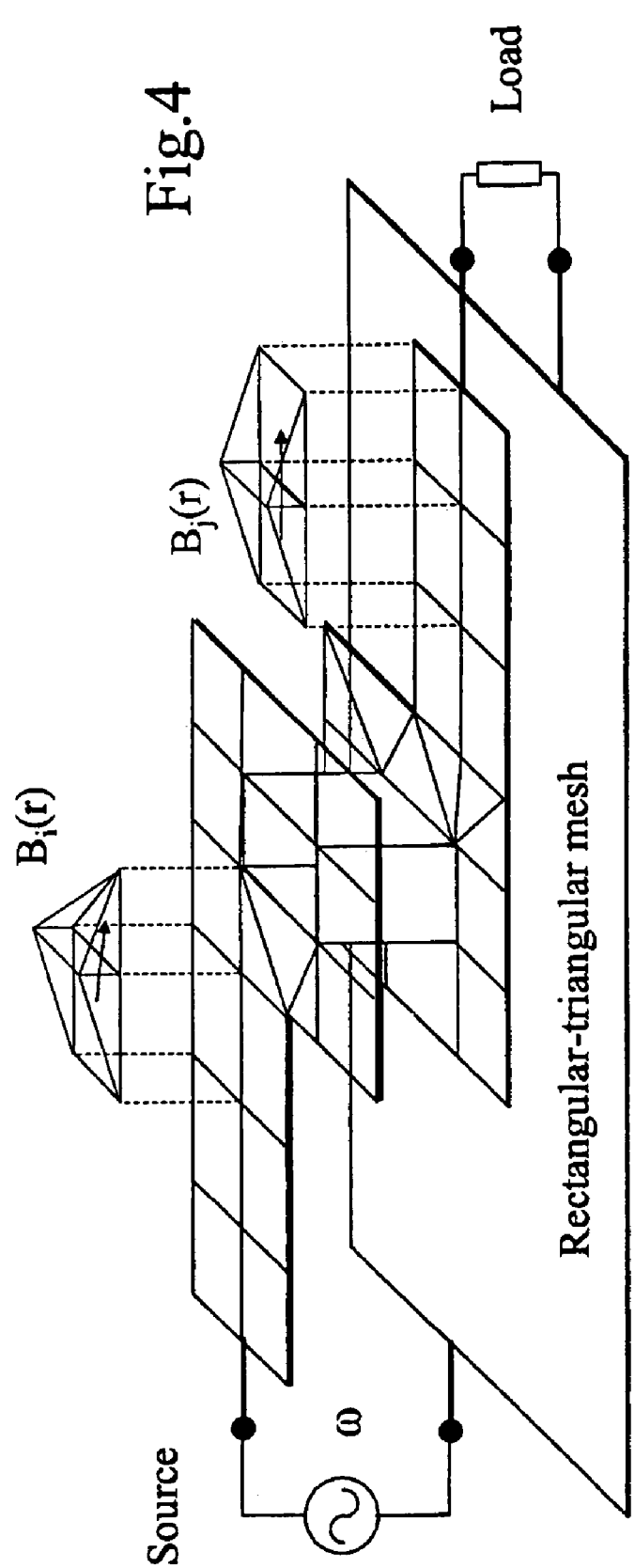
FIG. 4 shows an example of a mixed rectangular-triangular mesh to discretise the sheet conductor surface of FIG. 1 and rooftop basis functions to model the surface currents.
Figure 5:
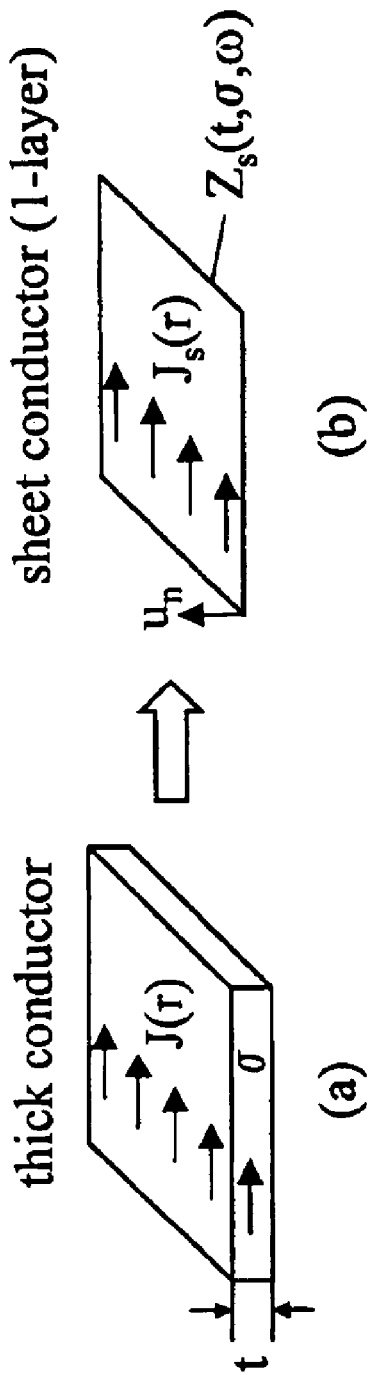
FIGS. 5 and 6 illustrate one-layer and two-layer sheet conductor approaches for modelling conductor loss and skin effect.

For convenience an example implementation of the invention will be described in the context of electronic circuit design, using apparatus as shown in FIG. 8 for simulating operation of an electronic circuit.

Referring to FIG. 8, the apparatus comprises a processing unit 10 and a user input/output interface unit 12. The processing unit 10 includes a central processing unit (CPU), random-access memory (RAM), hard disc storage and associated circuitry to enable the CPU to implement procedures in accordance with software program instructions stored in the RAM, and to interact with the interface unit 12 to receive input from the user and display the results of the procedures. The interface unit 12 typically comprises a visual-display unit (VDU), keyboard, mouse and/or tablet or similar pointing device, and a printer or other hard-copy output device.

In preparing to perform a system simulation, the apparatus receives, via the interface unit 12, a physical description of the system at step 20, for example a list of components of an electronic circuit, their operating characteristics (e.g. resistance, capacitance, gain as a function of frequency, etc.), their interconnection (such as the location and dimension of electrical conductors) and other details of the circuit layout. At step 22 the apparatus derives a model of the system's behaviour over the frequency range of interest. To the extent this involves modelling of 3D conductive and dielectric bodies, the step 22 applies the techniques described in more detail below; this step also typically involves the use of other circuit modelling and simulation techniques already known to those skilled in the art. At step 24 the resulting model is used to simulate operation of the system and generate output data that describes such operation. These output data may comprise, for example, graphical displays of circuit operating characteristics, such as Bode diagrams, Smith charts and pole-zero diagrams, and numerical descriptions such as parameter values for formulae that summarise the system's properties. The output data are supplied to the user via the interface unit 12, and may be used to understand the operating characteristics of the simulated system, compare its behaviour with that which is desired, refine the design of the system, and provide data to control manufacturing processes to assemble a practical implementation of the system.

The operation of the apparatus in relation to step 20 is conventional, and need not be described further here. The derivation of the model, in particular in relation to simulation of 3D conducting or dielectric bodies, proceeds as follows.

The invention will be described with reference to the novel concept of a "surface impedance operator", which can be viewed as a generalization of the scalar surface impedance concept discussed above. The surface impedance operator enables the problem of a thick conductor (or dielectric) in a multilayered medium to be described in a rigorous and exact way by means only of equivalent electric surface currents at the surface of the conductor.

Figure 9:
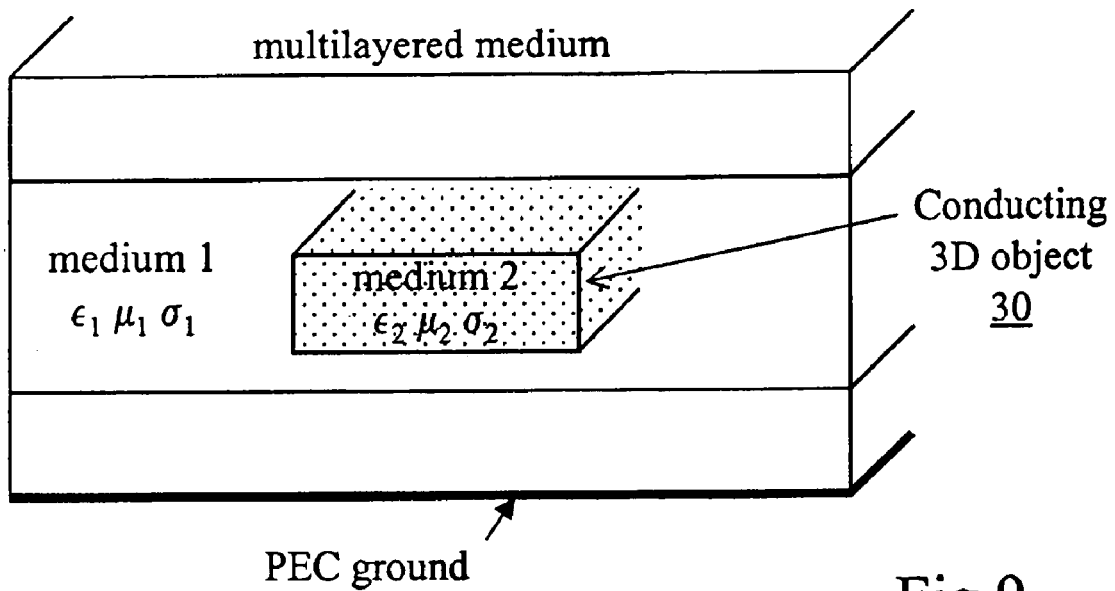
FIG. 9 shows a schematic example of a multilayered medium with an embedded 3D conductor (or dielectric)

Referring to FIG. 9, there is shown a finite homogeneous 3D conducting object 30 consisting of a medium 2 with constitutive electromagnetic parameters $\epsilon_2$ (permittivity), $\mu_2$ (permeability) and $\sigma_2$ (conductivity). This object is embedded in a layer of the planar multilayered medium, this layer comprising a medium 1 with respective parameters $\epsilon_1$, $\mu_1$, $\sigma_1$. A boundary surface S exists between the medium 1 and the medium 2, defining the conducting object 30.

As explained above, a conventional planar EM simulator being used to simulate a structure like that shown in FIG. 9 essentially relies on the calculation of the Green's functions of the layered background medium. The presence of infinitely thin conductors would then be accounted for by including surface currents running over those conductors. However, FIG. 9 clearly shows that the layered structure is disrupted by the presence of the 3D conducting object 30. Since the medium 2 is conducting, volume currents will also be present, further violating the basic assumption of the planar EM simulator, which relies on the modelling solely of surface currents. Even if the medium 2 is a pure dielectric (non-conducting) these considerations remain valid: it suffices to replace the conduction currents by their displacement current equivalents (i.e. replace J by jωD).

Figure 10:
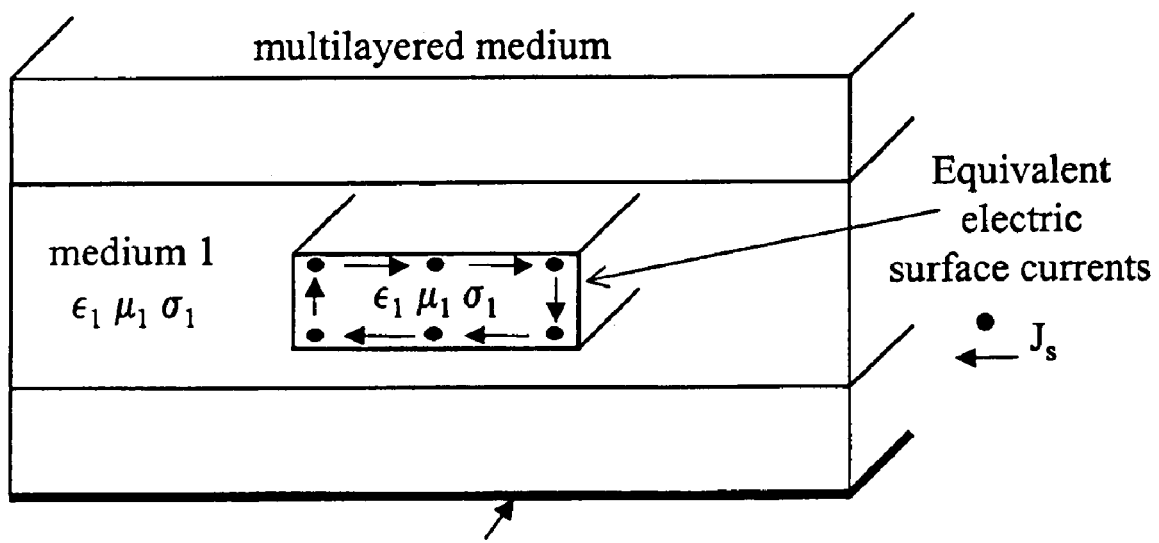
FIG. 10 shows the multilayered medium of FIG. 9 with the substitution of equivalent surface currents, in accordance with the invention, allowing restoration of the original background medium.

The present invention introduces a notional surface current $J_S$ at the boundary surface S between the medium 1 and the medium 2. The properties of this notional current are chosen, as described hereinafter, such that:

the material of the medium 2 can be replaced in the simulation by that of the medium 1; in this way the uniform nature of the layered background medium can be restored, as shown in FIG. 10;

the notional current $J_s$ can be used in the further modelling process as the sole current necessary to solve the overall field problem; and the current $J_s$ depends on the electric field through a surface impedance operator $Z_s[\ ]$ or surface admittance operator $Y_s[\ ]$ represented by boundary surface integrals in the following way:

$$u_n \times E(r) = u_n \times Z_s[J_s(r)] = u_n \times \iint_S dS' \bar{\bar{Z}}_s(r,r') \cdot J_s(r') \quad (14)$$

$$u_n \times J_s(r) = u_n \times Y_s[E(r)] = u_n \times \iint_S dS' \bar{\bar{Y}}_s(r,r') \cdot E(r') \quad (15)$$

Thus the invention proposes the introduction of a selected notional boundary surface current that enables restoration of the nature of the planar stratified background medium. This in turn permits the retention, when modelling finite (non-zero) volume 3D conductors/dielectrics, of use of the existing solution mechanism of planar EM solver technology as applied to the case of infinitely thin conductors. This is not without cost, i.e. a more complex surface impedance/admittance definition, but this does fit seamlessly into the planar EM solver concept.

Expression (14) states that the tangential electric field everywhere on the surface S depends on the complete surface current on S; conversely expression (15) states that the surface current at each point on S is a function of tangential electric fields on S. These expressions are generalizations of the simple scalar surface impedance (and analogous surface admittance) introduced in expression (1), i.e.

$$u_n \times E(r) = u_n \times Z_s J_s(r) \quad (16)$$

$$u_n \times J_s(r) = u_n \times Y_s E(r) \quad (17)$$

(with $Y_s = 1/Z_s$) which is a simple scalar relationship between the surface current and the tangential electric field at each point on the surface S.

In expression (14) the dyadic term $\bar{\bar{Z}}_s(r,r')$ is the general surface impedance kernel. The scalar surface impedance relation (16) is a special case of the general surface impedance relation (14), provided that the surface impedance kernel is defined using the unit dyadic and the Dirac delta pulse function:

$$\bar{\bar{Z}}_s(r,r') = Z_s \bar{\bar{I}} \delta(r-r') \quad (18)$$

where the notation I with two overlines indicates the unit dyadic.

In the following description several ways to determine the surface impedance operator $Z_s$ or the surface admittance operator $Y_s$ will be presented. It is worth noting at this point that existing so-called "equivalence theorems" introduce both a notional electric current $J_s$ and a notional magnetic current $M_s$. One significant difference between this invention and those equivalence theorems is that the present invention introduces only an electric current $J_s$ but no magnetic current $M_s$.

The general surface impedance operator relationship between the notional surface currents and the electric field presented in expression (14) is determined in such a way that it ensures that the tangential electric and magnetic fields at the surface of the conductor (FIG. 9) are identical to those in the configuration with the notional surface currents (FIG. 10).

Using the current $J_s$ in combination with the general surface impedance defined in expression (14) enables retention of the planar EM modelling process as outlined above to determine the actual value of $J_s$. The mixed potential integral equation (8) is generalized to:

$$E_t^{in}(r) = j\omega A_t[J_s(r)] + \nabla_t V[q_s(r)] + Z_s[J_s(r)] \quad (19)$$

This leads to a generalization of the resistive term in the interaction matrix elements (12a, 12b) of the MoM solution process:

$$Z_{i,j}^R = \iint_S dS B_i(r) \cdot \iint_S dS' \bar{\bar{Z}}_s(r,r') \cdot B_j(r') \quad (20)$$

The total Joule losses $P_{loss}$ in medium 1 can be determined directly from the sole knowledge of $J_s$ as $$P_{Loss} = \frac{1}{2} \text{Re} \left[ \iint_S dS J_s^*(r) \cdot \iint_S dS' \bar{\bar{Z}}s(r,r') \cdot J_s(r') \right] \quad (21)$$

where Re[ ] stands for the real part and "*" for the complex conjugate.

Thus the general surface impedance concept enables modelling of a 3D conducting object in a multilayered medium by means of a well-chosen notional surface current placed at the boundary of the conductor in the original background medium. This permits the nature of the planar stratified background medium to be restored and the solution process of the planar EM solver for the external problem to be retained. One advantage of this approach is that the Green's functions $G^A(r,r')$ and $G^V(r,r')$ in expression (13) can still be used without modification. This approach does incur a cost, i.e. a more complex surface impedance definition, but this fits seamlessly into the planar EM solver concept.

In the situations discussed above the Green's functions $G^A(r,r')$ and $G^V(r,r')$ in expression (13) describe the behaviour of electric surface currents in the planar stratified background medium in which the conductors are embedded. Any disruption of the planar stratified character of this background medium other than by surface currents (e.g. the inclusion of a finite piece of dielectric material) makes it impossible to apply these Green's functions using previously described techniques. In many technologies such as optical waveguides, photonic and electromagnetic crystals, packaging applications using a cavity in a layered medium, and dielectric resonators, the background medium is disrupted by the presence of finite volume dielectrics with properties that differ from the surrounding background medium, so the same limitation in the use by conventional techniques of the Green's functions applies. However, the general surface impedance operator concept described herein resolves this problem just as effectively for finite dielectrics as for finite conductors, thereby permitting use of the Green's functions $G^A(r,r')$ and $G^V(r,r')$ without modification.

The impedance/admittance operators $Z_s$, $Y_s$ can be introduced into the planar solver at various levels of complexity. Examples will be given below of one-dimensional approximation, two-dimensional approximation, and the full and exact three-dimensional case.

The One-Dimensional Approximation

Figure 11:
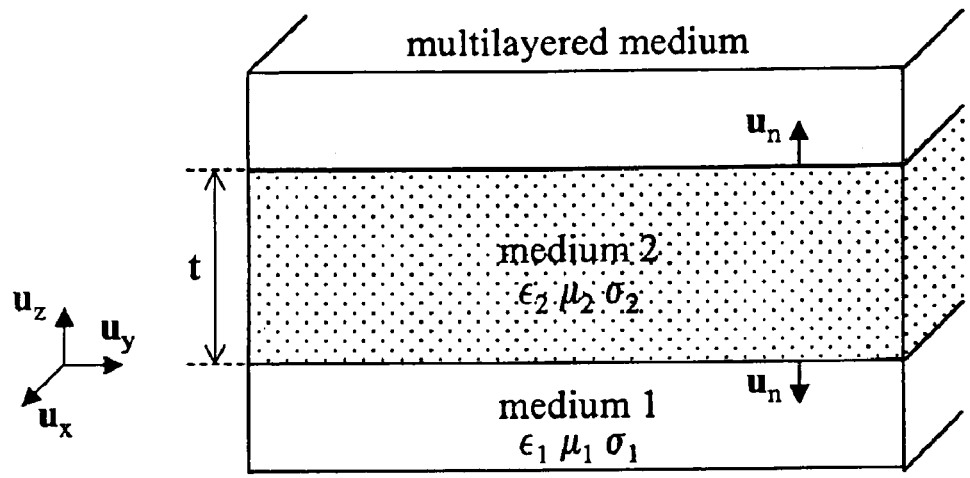
FIG. 11 illustrates the geometry for an implementation of the invention using a one-dimensional approximation of a finite thickness conductor plate in a multilayered background medium.

The surface impedance operator can be derived in closed form for the one-dimensional field problem associated with a finite thickness conductor plate of infinite extent in the lateral (x, y) dimensions, illustrated in FIG. 11. The field problem is one-dimensional in the sense that the field components only depend upon a single (z) coordinate in the vertical direction of the multilayered medium. Without loss of generality, the E-field can be assumed to be oriented along the x-direction and the H-field along the y-direction. Hence:

$E(r) = E_x(z) u_x$ $H(r) = H_y(z) u_y$ \quad (22)

Also the origin of the coordinate system is chosen to be on the bottom surface of the conductor plate (shown with dotted fill in FIG. 11) and the outwards-oriented unit vector normal to the conductor surfaces is denoted by $u_n$. From Maxwell's equations it follows that the fields inside the conductor (medium 2) satisfy the one-dimensional Helmholtz equations:

$$\begin{cases} \frac{\partial^2 E_x}{\partial z^2}(z) + k_{c,2}^2 E_x(z) = 0 \\ \frac{\partial E_x}{\partial z}(z) = -j\omega\mu_2 H_y(z) \end{cases} \quad (23)$$

with $jk_{c,2} = \sqrt{j\omega\mu_2(\sigma_2 + j\omega\varepsilon_2)}$

In expression (23), $k_{c,2}$ is the complex propagation constant inside the finite thickness conductor. The general solution of expression (23) can be written in terms of two plane waves:

$$\begin{cases} E_x(z) = Ae^{-jk_{c,2}z} + Be^{jk_{c,2}z} \\ H_y(z) = \frac{1}{Z_{c,2}}(Ae^{-jk_{c,2}z} - Be^{jk_{c,2}z}) \end{cases} \quad (24)$$

with $Z_{c,2} = \sqrt{\frac{j\omega\mu_2}{\sigma_2 + j\omega\varepsilon_2}}$ where A and B are complex constants and $Z_{c,2}$ is the complex characteristic impedance for the plane wave propagation inside the finite thickness conductor.

The relation between the E and H field components at the top and bottom surfaces of the conducting plate can be derived from expression (24), by elimination of the complex constants A and B. Denoting the components of the fields at the bottom surface (z=0) by ($E_1$, $u_n \times H_1$) and at the top surface (z=t) by ($E_2$, $u_n \times H_2$), the following relationship is obtained:

$$\begin{bmatrix} E_1 \\ E_2 \end{bmatrix} = \frac{Z_{c,2}}{j\sin(k_{c,2}t)} \begin{bmatrix} \cos(k_{c,2}t) & 1 \\ 1 & \cos(k_{c,2}t) \end{bmatrix} \cdot \begin{bmatrix} u_n \times H_1 \\ u_n \times H_2 \end{bmatrix} \quad (25)$$

with $E_1 = E_x(0) u_x$ $E_2 = E_x(t) u_x$ and $u_n \times H_1 = H_y(0) u_x$ $u_n \times H_2 = -H_y(t) u_x$ Due to the continuity of the tangential field components at the surfaces of the conducting plate, relation (25) holds for both the field components at the surface just inside the conductor (internal fields in medium 2) and just outside the conductor (external fields in medium 1). Inverting relation (25) yields the H-field surface components as a function of the E-field components:

$$\begin{bmatrix} u_n \times H_1 \\ u_n \times H_2 \end{bmatrix} = \underbrace{\frac{1}{jZ_{c,2}\sin(k_{c,2}t)} \begin{bmatrix} \cos(k_{c,2}t) & -1 \\ -1 & \cos(k_{c,2}t) \end{bmatrix}}_{[Y_{c,2}]} \cdot \begin{bmatrix} E_1 \\ E_2 \end{bmatrix} \quad (26)$$

$[Y_{c,2}]$ is the characteristic admittance matrix for plane wave propagation through medium 2.

Figure 12:
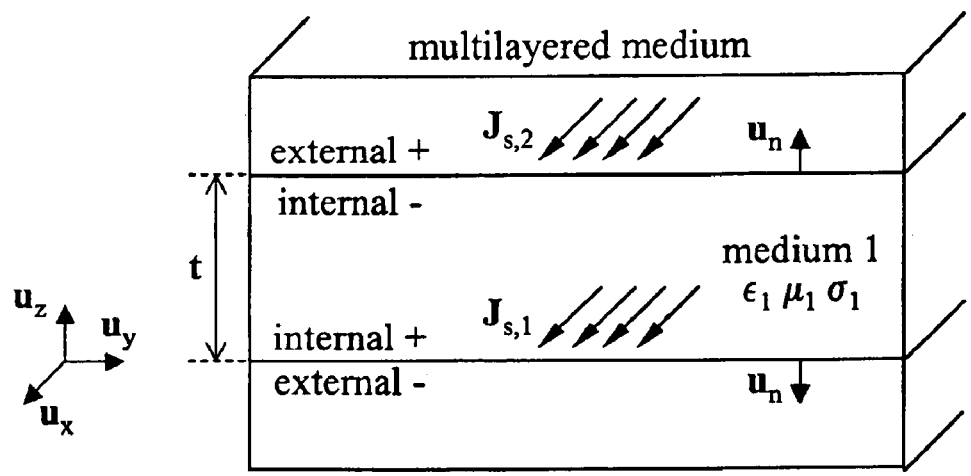
FIG. 12 shows an equivalent geometry to that of FIG. 11, with notional surface currents in the multilayered background medium.

Next the equivalent geometry is considered where the conducting plate is replaced by the background medium and a notional surface current is introduced at the top and bottom surface, as shown in FIG. 12. As with the electric field, the notional surface current is oriented along the x-direction and depends only on the z coordinate. This implies that the surface current is uniformly distributed in the (x, y) plane and hence is divergence free (solenoidal), that is, there is no surface charge associated with this current:

$$J_s(r) = J_{s,1} + J_{s,2} = J_{x,1}u_x + J_{x,2}u_x$$

$$\nabla \cdot J_s(r) = 0 \tag{27}$$

The surface currents introduce a jump in the tangential magnetic field at the bottom and top surface, while the tangential electric field components are continuous. Thus:

$$E_1^{ext} = E_1^{int} \text{ for } z=0$$

$$E_2^{ext} = E_2^{int} \text{ for } z=t \tag{28}$$

$$J_{s,1} = u_n \times H_1^{ext} - u_n \times H_1^{int} \text{ for } z=0$$

$$J_{s,2} = u_n \times H_2^{ext} - u_n \times H_2^{ext} \text{ for } z=t \tag{29}$$

The superscripts "ext" and "int" denote whether the field components are external (outside the layer that replaces the conductor) or internal (inside the layer that replaces the conductor). Owing to the choice of the z-axis, for the bottom layer "external" refers to $z=0^-$ and "internal" to $z=0^+$, while for the top layer "external" refers to $z=t^+$ and "internal" to $z=t^-$ (FIG. 12). Since the tangential electric field components are continuous at the top and bottom surface current, there is no need here to add the superscripts "int" or "ext".

The internal electric and magnetic field components satisfy the same relations (25) and (26), provided that the material properties of the conducting plate $(k_{c,2}, Z_{c,2})$ are replaced by the material properties of the background medium $(k_{c,1}, Z_{c,1})$. Applying the boundary conditions (28) and (29) yields the following relation between the external electric and magnetic field components for the equivalent geometry shown in FIG. 12:

$$\begin{bmatrix} u_n \times H_1^{ext} \\ u_n \times H_2^{ext} \end{bmatrix} = \begin{bmatrix} J_{s,1} \\ J_{s,2} \end{bmatrix} + \underbrace{\frac{1}{jZ_{c,1}\sin(k_{c,1}t)} \begin{bmatrix} \cos(k_{c,1}t) & -1 \\ -1 & \cos(k_{c,1}t) \end{bmatrix}}_{[Y_{c,1}]} \cdot \begin{bmatrix} E_1^{ext} \\ E_2^{ext} \end{bmatrix} \tag{30}$$

Here, $[Y_{c,1}]$ is the characteristic admittance matrix for plane wave propagation through medium 1.

The equivalence of the situations depicted in FIGS. 11 and 12 is now enforced for the external fields outside the conducting plate. That is, the notional surface currents are chosen such that the external fields in the equivalent geometry (FIG. 12) are identical at each point outside the conducting plate to those with the fields external to the conducting plate (FIG. 11). A necessary and sufficient condition for this equivalence is that the surface components of the electric and magnetic fields at the top and bottom surfaces of the conductor are identical. Hence expressions (26) and (30) are equivalent relations and can be used to eliminate the magnetic field components, yielding the surface impedance relation shown below between the electric fields and the notional surface currents at the top and bottom of a finite thickness conductor plate.

$$\begin{bmatrix} E_1 \\ E_2 \end{bmatrix} = [[Y_{c,2}] - [Y_{c,1}]]^{-1} \cdot \begin{bmatrix} J_{s,1} \\ J_{s,2} \end{bmatrix} \tag{31}$$

Using the expressions for the characteristic admittance matrices as defined in connection with expressions (26) and (30), the surface impedance relation can be rewritten to obtain:

$$\begin{bmatrix} E_1 \\ E_2 \end{bmatrix} = \begin{bmatrix} Z_{s,s} & Z_{s,m} \\ Z_{s,m} & Z_{s,s} \end{bmatrix} \cdot \begin{bmatrix} J_{s,1} \\ J_{s,2} \end{bmatrix} \tag{32}$$

with $$Z_{s,s} = \frac{1}{2}(Z_1 + Z_2)$$

$$Z_{s,m} = \frac{1}{2}(Z_1 - Z_2)$$

and $$Z_1 = \frac{Z_{c,1}Z_{c,2}}{Z_{c,1}\tanh\left(jk_{c,2}\frac{t}{2}\right) - Z_{c,2}\tanh\left(jk_{c,1}\frac{t}{2}\right)}$$

$$Z_2 = \frac{Z_{c,1}Z_{c,2}}{Z_{c,1}\coth\left(jk_{c,2}\frac{t}{2}\right) - Z_{c,2}\coth\left(jk_{c,1}\frac{t}{2}\right)}$$

The general surface impedance operator based on the one-dimensional approximation is given by:

$$\overline{Z}_s(r;r') = Z_{s,s}\overline{I}\delta(\rho-\rho')\delta(z-z') + Z_{s,m}\overline{I}\delta(\rho-\rho')\delta(z-z'\pm t) \tag{33}$$

where $\rho = xu_x + yu_y$ is the lateral position vector, $\overline{I}$ is the unit dyadic and $\delta(\ )$ is the delta Dirac function.

Figure 6:
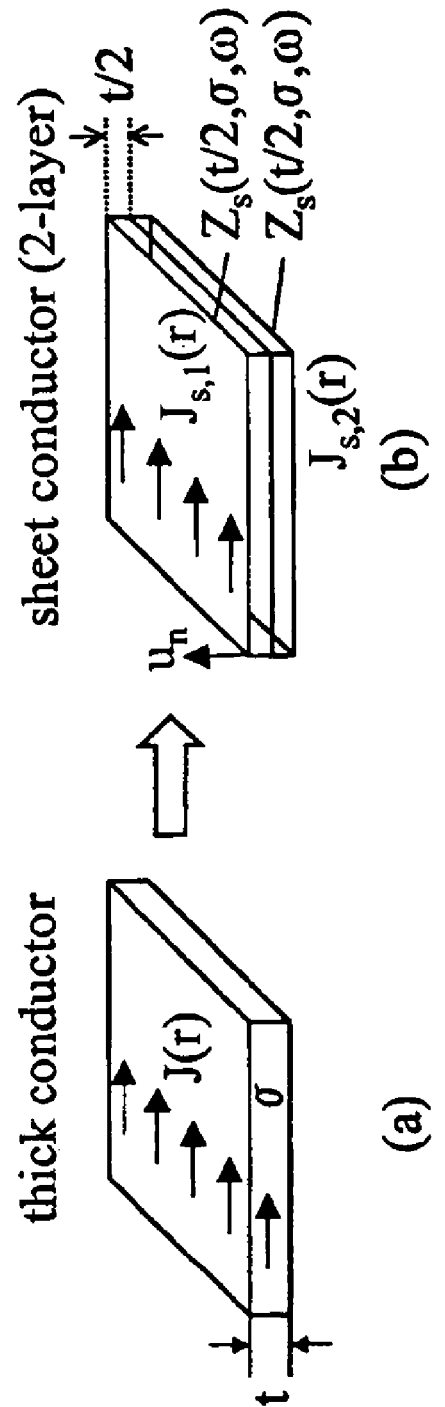
Figure 7:
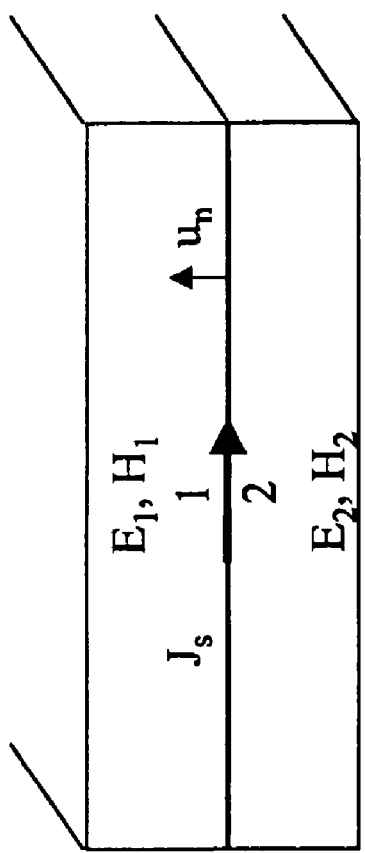
FIG. 7 illustrates jump conditions satisfied by planar solvers in the simulation of fields at the surface current layer.

The one-dimensional surface impedance operator given by expression (33) is used in the MoM solution procedure for the external field problem described above, yielding a model for the conductor loss similar to the two-layer sheet conductor model described with reference to FIG. 6. That is, the volume of the thick conductor is removed and replaced by two notional surface current layers, one at the top surface and the other at the bottom surface of the conductor. The planar EM simulation technology is applied to determine these surface currents, taking care that the meshes on the top and bottom layers are identical by first meshing the bottom layer and copying this mesh onto the top layer. This step comprises the automatic mesh expansion step for thick conductors.

Figure 13:
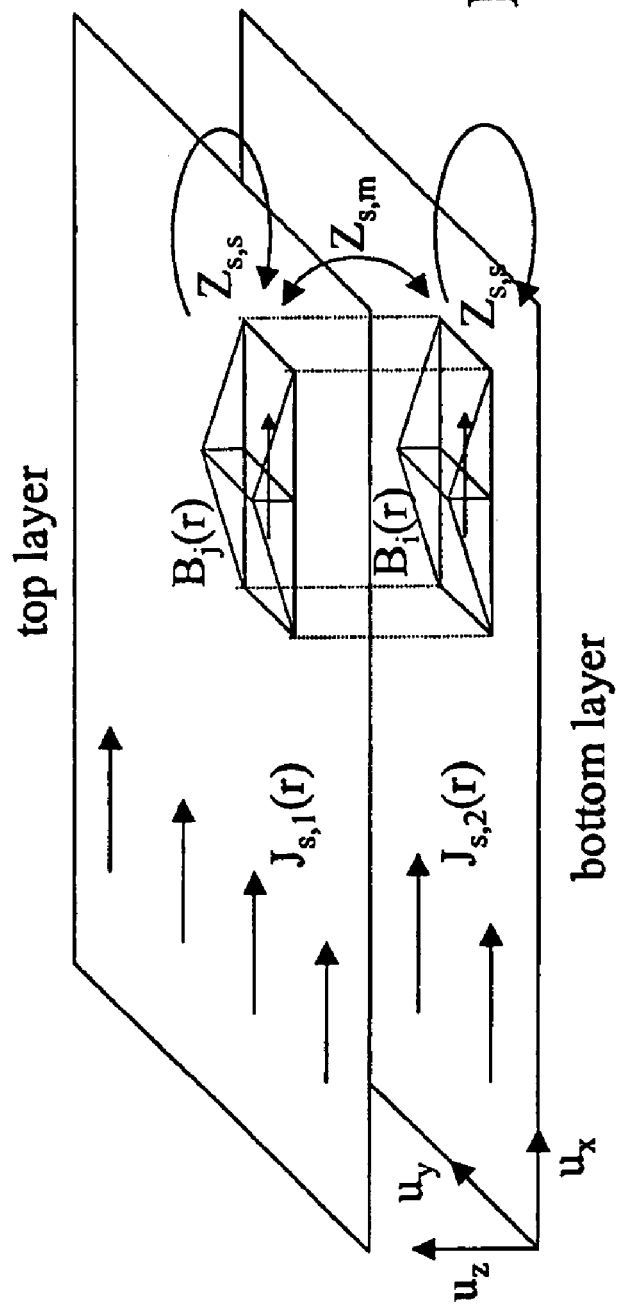
FIG. 13 illustrates the application of a one-dimensional surface impedance operator.

The surface impedance operator of expression (33) yields a self contribution $Z_{s,s}$ for overlapping basis functions and a mutual contribution $Z_{s,m}$ for basis functions $B_i$ and $B_j$ on the top and bottom conductor layers that are part of vertical overlaying cells (see FIG. 13). The distribution of the current flow between the top and bottom layers follows from the planar EM equations. This new two-layer approach has an important advantage over the conventional two-layer sheet model, in that the surface impedances used for the top and bottom layers are inherently mutually coupled and hence the mutual internal inductance between the two layers is automatically taken into account in the simulation. This feature is lacking in the known two-layer sheet model.

The Two-Dimensional Approximation

Figure 14:
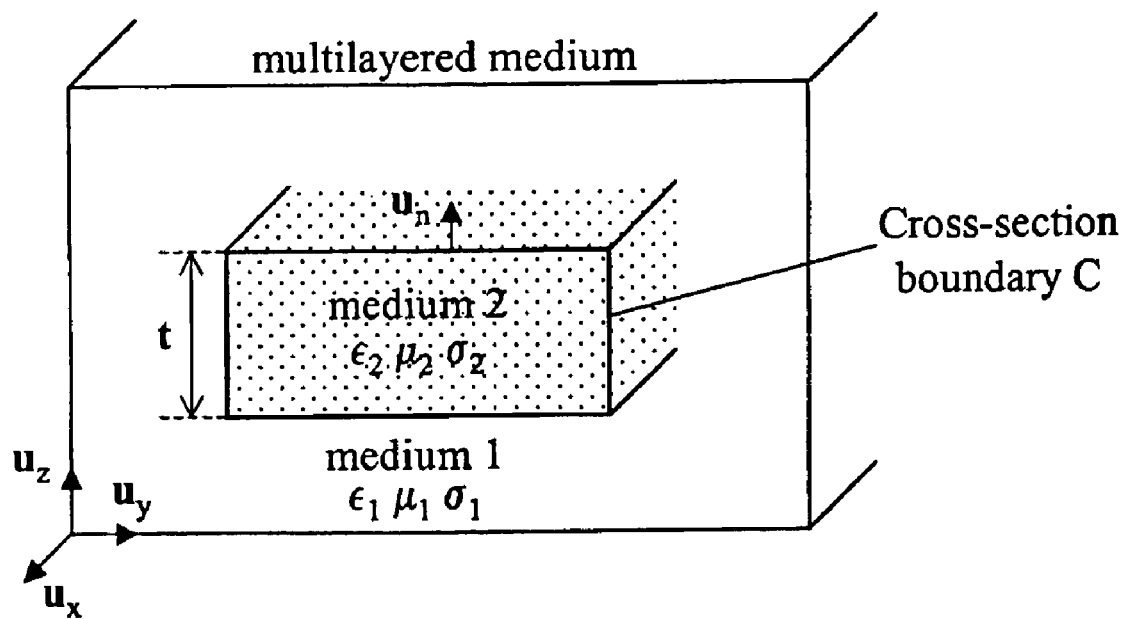
FIG. 14 illustrates the geometry for an implementation of the invention using a two-dimensional approximation of a finite thickness conductor in a multilayered background medium.

In this case the conductor is treated on a cross-section per cross-section basis. A typical cross-section is depicted in FIG. 14: a rectangular cross-section with boundary curve C. The conductor is assumed to be infinitely long in the direction perpendicular to the cross-section (the x-direction in FIG. 14). In this case the dependence of the fields upon the coordinate perpendicular to the cross-section is neglected. Thus, in the example of FIG. 14 fields will only vary in accordance with the y and z coordinates and not with x. With this simplification, two polarizations remain to be considered: transverse magnetic (TM) polarization with the magnetic field in the cross-section and the electric field perpendicular to the cross-section ($E_x$, $H_y$, $H_z$) and transverse electric (TE) polarization with the electric field in the cross-section and the magnetic field perpendicular to the cross-section ($H_x$, $E_y$, $E_z$ in FIG. 14). Contrary to the one-dimensional approximation, the two-dimensional approximation is inherently and advantageously suited to assess the effect of current crowding near the corners of the cross-section.

TM-Polarization

In the case of TM-polarization, the magnetic field is oriented in the cross-section of the conductor and the electric field is perpendicular to the cross-section and hence tangential to the conductor. With the orientation of the (x,y,z) axes as depicted in FIG. 14, only the $E_x$, $H_y$ and $H_z$ components of the fields depend upon the cross-section coordinates (y,z). Hence:

$$E(r) = E_x(y,z) u_x$$

$$H(r) = H_y(y,z) u_y + H_z(y,z) u_z \quad (34)$$

From Maxwell's equations it follows that the fields inside the conductor (medium 2) satisfy the two-dimensional Helmholtz equations:

$$\begin{cases} \nabla^2_{yz} E_x(r_{yz}) + k^2_{c,2} E_x(r_{yz}) = 0 \\ u_x \times \nabla_{yz} E_x(r_{yz}) = j\omega\mu_2 H(r_{yz}) \end{cases} \quad (35)$$

with $$jk_{c,2} = \sqrt{j\omega\mu_2(\sigma_2 + j\omega\varepsilon_2)}$$

$$r_{yz} = y u_y + z u_z$$

$$\nabla_{yz} = \frac{\partial}{\partial y} u_y + \frac{\partial}{\partial z} u_z$$

The subscript "yz" in expression (35) denotes that only the (y,z) components are considered. In order to simplify the formulae, this subscript will be omitted in the remainder of this section but is understood to be present.

The homogenous Green's function $G_2(r,r')$ for the two-dimensional scalar wave equation in medium 2 satisfies the equation:

$$\nabla^2 G_2(r,r') + k_{c,2}^2 G_2(r,r') = \delta(r-r') \quad (36)$$

The two-dimensional Green's function that satisfies the radiation condition is given by:

$$G_2(r, r') = \frac{j}{4} H_0^{(2)}(k_{c,2}|r - r'|) \quad (37)$$

where r and r' denote the position vector in the (y,z) cross section and $H_0^{(2)}$ denotes the Hankel function of zeroth order and of the second kind. From expressions (35) and (36) and using Green's theorem, an integral representation for the electric field can be derived for any point r inside the conductor as a function of the values at the boundary C:

$$E(r) = \int_C dc' \left[ E(r') \frac{\partial G_2}{\partial n'}(r, r') - G_2(r, r') \frac{\partial E}{\partial n'}(r') \right] \quad (38)$$

Taking the limit for r→C, careful analysis shows that for a smooth contour C the electric field at the boundary of the conductor is given by:

$$E(r) = 2 \int_C dc' \left[ E(r') \frac{\partial G_2}{\partial n'}(r, r') - G_2(r, r') \frac{\partial E}{\partial n'}(r') \right] \quad (39)$$

Note should be taken of the factor 2 difference between expressions (38) and (39). Owing to the continuity of the tangential electric field component, the boundary integral representation (39) is valid for the electric field at the boundary C coming from inside the conductor (internal field in medium 2) and coming from outside the conductor (external field in medium 1). In the two-dimensional approach, the normal surface derivative of the electric field is related to the magnetic field at the boundary C as follows:

$$\frac{\partial E}{\partial n} = (u_n \cdot \nabla) E = j\omega\mu_2 (u_n \times H) \quad (40)$$

Hence, relation (39) can be reformulated using expression (40) to obtain $$E(r) = 2 \int_C dc' \left[ E(r') \frac{\partial G_2}{\partial n'}(r, r') - j\omega\mu_2 G_2(r, r')(u'_n \times H(r')) \right] \quad (41)$$

Figure 15:
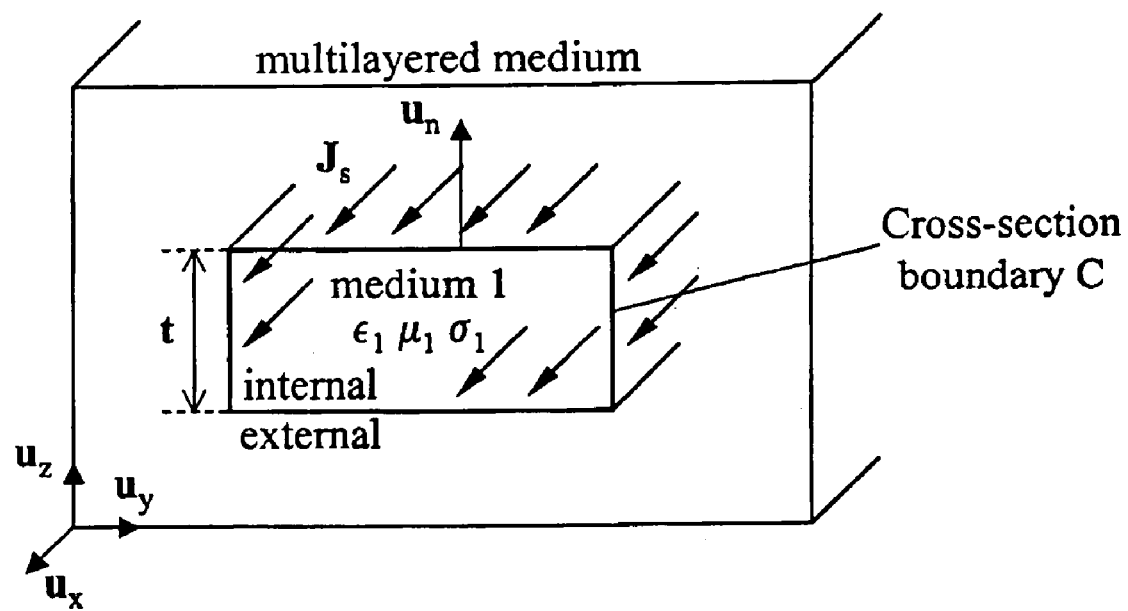
FIG. 15 shows an equivalent geometry to that of FIG. 14, with notional surface currents in the multilayered background medium.

As in the one-dimensional approach, the equivalent geometry is considered where the conductor is replaced by the background medium and a notional surface current $J_s(r)$ is introduced at the boundary of the conductor (FIG. 15). For the TM polarization, this surface current is oriented perpendicularly to the cross-section and depends only on the (y,z) cross-section coordinates. This implies that the surface current is uniform in the x-direction and hence divergence free (solenoidal), that is, there is no surface charge associated with this current:

$$J_s(r) = J_x(y,z) u_x$$

$$\nabla \cdot J_s(r) = 0 \quad (42)$$

The surface currents introduce a jump in the tangential magnetic field, while the tangential electric field remains continuous. The superscripts "ext" and "int" are used below to denote whether the field components are external Oust outside the boundary C) or internal (just inside the boundary C). The boundary conditions at the surface currents are:

$$E^{ext}(r) = E^{int}(r) \text{ r on C} \quad (43a)$$

$$J_s(r) = u_n \times H^{ext}(r) - u_n \times H^{int}(r) \text{ r on C} \quad (43b)$$

The internal electric and magnetic field components satisfy to the same relation (41), provided that the material properties of the conductor are replaced by the material properties of the background medium. Applying the boundary conditions (43a) and (43b) yields the following relation between the external electric and magnetic field components for the equivalent geometry of FIG. 15:

$$E^{ext}(r) = 2\int_C dc' \qquad (44)$$
$$\left[E^{ext}(r')\frac{\partial G_1}{\partial n'}(r, r') - j\omega\mu_1 G_1(r, r')(u'_n \times H^{ext}(r'))\right] +$$
$$2\int_C dc'[j\omega\mu_1 G_1(r, r')J_s(r')]$$

Dropping the superscript "ext" in expression (44) and in line with the general reasoning put forward above to define the surface impedance operator, expressions (41) and (44) should express identical relations between the tangential electric and magnetic fields on the boundary C. Hence the following set of boundary integral equations is obtained that determine the surface impedance operator:

$$E(r) = 2\int_C dc' \qquad (45a)$$
$$\left[E(r')\frac{\partial G_1}{\partial n'}(r, r') - j\omega\mu_1 G_1(r, r')(u'_n \times H(r'))\right] +$$
$$2\int_C dc'[j\omega\mu_1 G_1(r, r')J_s(r')]$$

$$E(r) = 2\int_C dc' \qquad (45b)$$
$$\left[E(r')\frac{\partial G_2}{\partial n'}(r, r') - j\omega\mu_2 G_2(r, r')(u'_n \times H(r'))\right]$$

Introducing operator notation the equations (45a) and (45b) can be rewritten into a more compact form:

$$Z_1[u_n \times H] = dZ_1[E] + Z_1[J_s] \qquad (46)$$

$$Z_2[u_n \times H] = dZ_2[E] \qquad (46)$$

where the two-dimensional boundary integral operators $Z_i[\ ]$ and $dZ_i[\ ]$ (i=1, 2) are defined by:

$$Z_i[F(r)] = \int_C dc'[j\omega\mu_i G_i(r, r')F(r')] \qquad (47)$$
$$dZ_i[F(r)] = \int_C dc'\left[\frac{\partial G_i}{\partial n'}(r, r')F(r')\right] - \frac{1}{2}F(r)$$

Italic script is used above to distinguish the operators from the vector quantities on which they operate.

The surface impedance operator is retrieved by eliminating the magnetic field from expression (46). Using symbolic operator manipulation:

$$E(r) = Z_s[J_s(r)] = [Z_2^{-1}dZ_2 - Z_1^{-1}dZ_1]^{-1}[J_s(r)] \qquad (48)$$

In the one-dimensional approach it was possible to obtain a closed-form expression for the surface impedance kernel, but this is no longer straightforward for the two-dimensional case. An optimal approach therefore is to discretise the boundary integral equations (46) using the same MoM discretisation on the boundary of the conductor as used for solving the external field problem. Elimination of the discretised tangential field yields the discrete surface impedance matrix. In this way there is no need to obtain an explicit expression for the surface impedance kernel as the discrete surface impedance matrix can be directly integrated in the MoM solution process for the external problem. A general outline of the MoM discretisation process is given below in the context of the general three-dimensional case.

Figure 16:
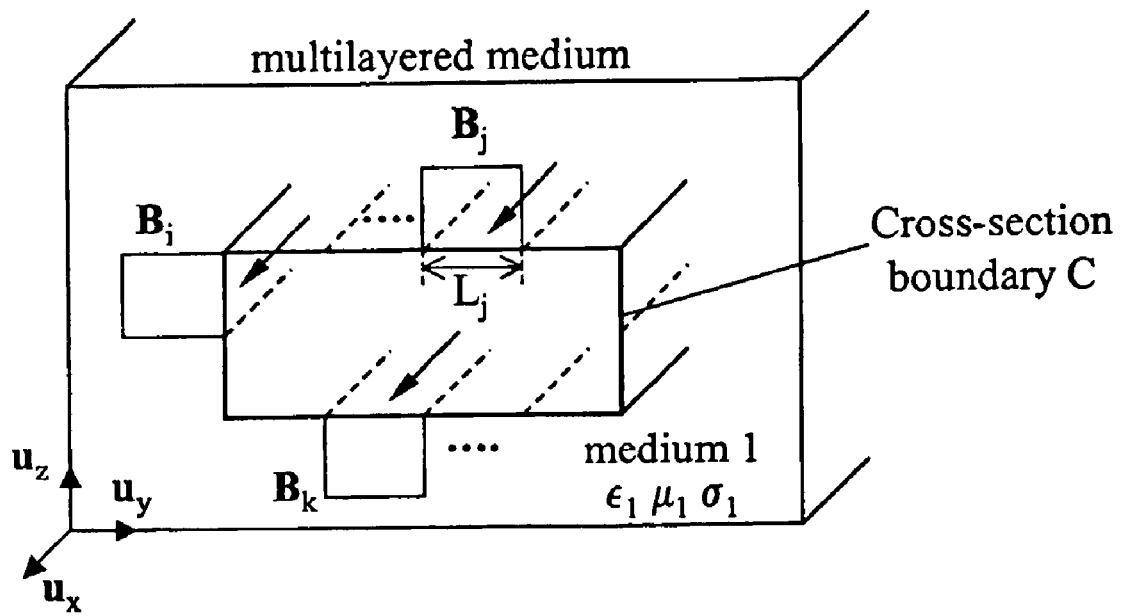
FIG. 16 illustrates discretisation of a two-dimensional approximation, using pulse basis functions defined over a cross-section boundary C.

For the two-dimensional TM-polarization case, the MoM solution process that corresponds with the cross-section problem is the approach where the surface currents and all the fields are approximated by a piecewise constant representation (FIG. 16). The cross-section boundary C is meshed in a finite number of line segments $C_j$, j=1, . . . , N. Pulse basis functions $B_j(r)$, j=1, . . . ,N defined over the line segments are used to model the surface currents and the fields. Thus the following discretisations are introduced:

$$J_s(r) = \sum_{j=1}^{N} I_j B_j(r) \qquad (49a)$$

$$E(r) = \sum_{j=1}^{N} E_j B_j(r) \qquad (49b)$$

$$u_n \times H(r) = \sum_{j=1}^{N} H_j B_j(r) \text{ with} \qquad (49c)$$

$$B_j(r) = \frac{1}{L_j} u_x \quad j = 1, \ldots, N \qquad (50)$$

In expressions (49a to 49c), $I_j$, $E_j$ and $H_j$ are respectively the unknown surface current, electric field and magnetic field amplitudes at the boundary surface. The unknown current amplitude $I_j$ in expression (49a) determines the current flowing through the line segment $C_j$. The pulse basis function $B_j(r)$ defined by expression (50) is normalized with respect to the length $L_j$ of the line segment. Hence, the total current that flows through the conductor can be obtained by simply taking the sum of all the individual current amplitudes.

Applying the MoM discretisation in combination with Galerkin testing to the set of boundary integral equations (46) yields the following set of matrix equations:

$$[Z_1]\cdot[H] = [dZ_1]\cdot[E] + [Z_1]\cdot[I]$$

$$[Z_2]\cdot[H] = [dZ_2]\cdot[E] \qquad (51)$$

Using N intervals to discretise C implies that $[Z_1]$, $[dZ_1]$, $[Z_2]$ and $[dZ_2]$ are N×N matrices, while [I], [E] and [H] are the N×1 column vectors containing the unknown discrete amplitudes. The elements of the matrices are defined by:

$$[Z_1]_{ij} = <B_i, Z_1[B_j]> \qquad (52)$$
$$= \int_C dcB_i(r)\cdot \int_C dc'[j\omega\mu_1 G_1(r, r')B_j(r')]$$
$$[Z_2]_{ij} = <B_i, Z_2[B_j]>$$
$$\int_C dcB_i(r)\cdot \int_C dc'[j\omega\mu_2 G_2(r, r')B_j(r')]$$
$$[dZ_1]_{ij} = <B_i, dZ_1[B_j]>$$
$$= \int_C dcB_i(r)\cdot \int_C dc'\left[\frac{\partial G_1}{\partial n'}(r, r')B_j(r')\right] -$$
$$\frac{1}{2}\int_C dcB_i(r)\cdot B_j(r)$$

-continued $$[dZ_2]_{ij} = <B_i, dZ_2[B_j]>$$

$$= \int_C dc B_i(r) \cdot \int_C dc' \left[ \frac{\partial G_2}{\partial n'}(r, r') B_j(r') \right] - \tag{(continued)}$$

$$\frac{1}{2} \int_C dc B_i(r) \cdot B_j(r)$$

In the expressions (52) <·,·> represents the Galerkin test operator.

Finally, elimination of [H] from expression (51) yields the discrete surface impedance matrix for the two-dimensional case:

$$[E]=[Z_s]\cdot[I]$$

with $[Z_s]=[[Z_2]^{-1}\cdot[dZ_2]-[Z_1]^{-1}\cdot[dZ_1]]^{-1}$ (53)

TE-Polarization

In the case of TE-polarization the electric field is oriented in the cross-section of the conductor and the magnetic field is perpendicular to the cross-section. With the orientation of the (x,y,z) axes as depicted in FIG. 14, only the $H_x$, $E_y$, and $E_z$ components of the fields depend upon the cross-section coordinates (y,z). The complete reasoning and derivation of the two-dimensional surface impedance operator as described above for the TM-case can be repeated for the TE-case, now starting from the proper integral equations for the x-component of the magnetic field. The tangential electric field and the surface current introduced at the cross-section boundary are now represented by triangular basis functions, i.e. the two-dimensional version of rooftops, to keep in line with the rooftop basis functions used in the 3D planar EM technology.

The Three-Dimensional Approach

Figure 17:
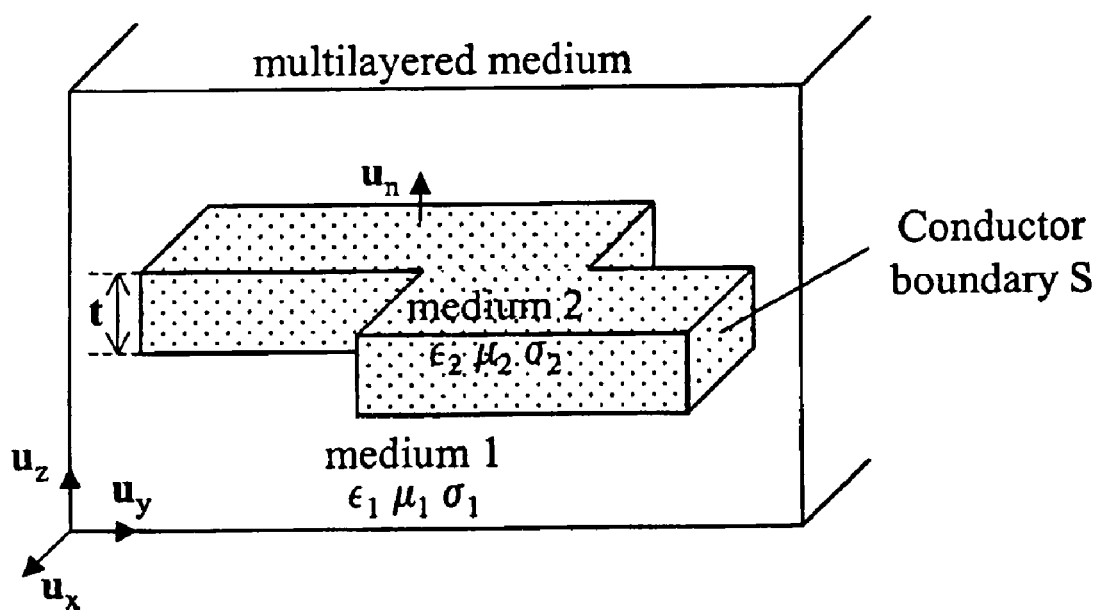
FIG. 17 illustrates the geometry for an implementation of the invention using a three-dimensional approximation of a finite thickness conductor in a multilayered background medium.

The full three-dimensional situation of a thick conductor placed in a multilayered medium is illustrated in FIG. 17. This case is the most complex but at the same time the most accurate as no approximations are made. The analysis provided by this invention to obtain the appropriate surface impedance formulation for the three-dimensional case is quite similar to the two-dimensional case. First a suitable integral representation is used to obtain a relationship between the tangential electric and magnetic fields on the 3D conductor surface. Use is made of the Poggio and Miller integral equations described above, which depend upon the three-dimensional scalar Green's function (and its derivatives) of the conductor material.

Figure 18:
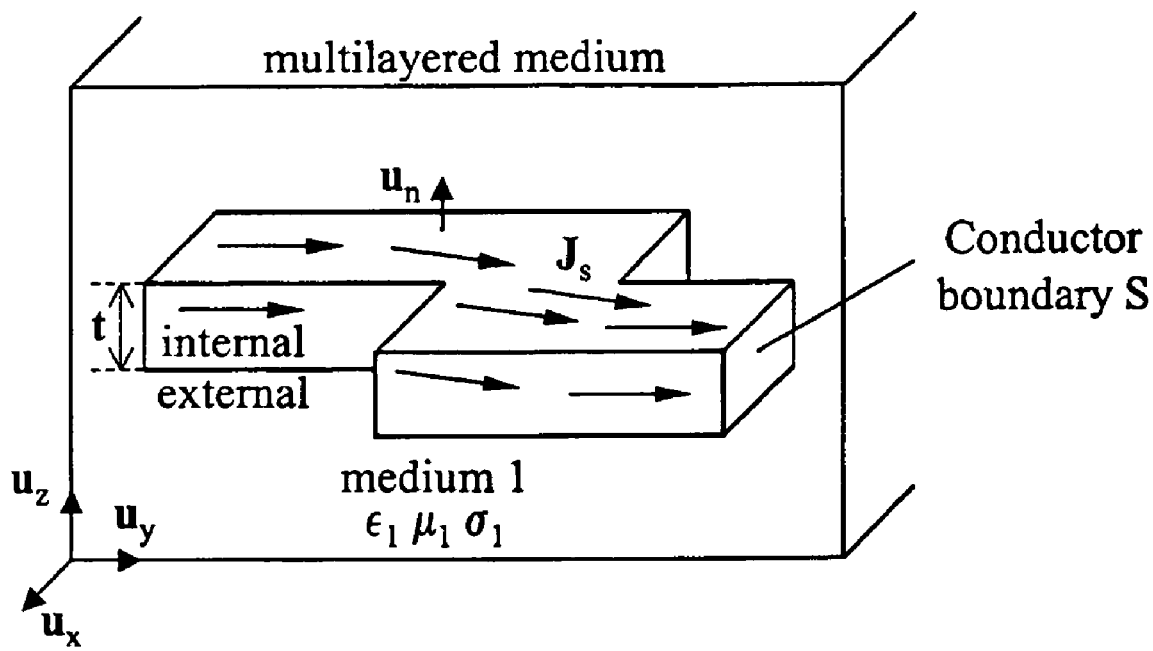
FIG. 18 shows an equivalent geometry to that of FIG. 17, with notional surface currents in the multilayered background medium.

According to Poggio and Miller in the work referenced above, the tangential electric field at an observation point r on the boundary S of the conductor is given by the surface integral representation below in terms of the tangential components of the electric and magnetic fields at the boundary S:

$$u_n \times E(r) = 2u_n \times \int\int_S dS' \left[ -j\omega\mu_2 G_2(r,r')(u'_n \times H(r')) - \right. \tag{54}$$

$$\left. \frac{1}{(\sigma_2 + j\omega\varepsilon_2)} \nabla' G_2(r,r') \nabla' \cdot (u'_n \times H(r')) \right] +$$

$$2u_n \times \int\int_S dS[(u'_n \times E(r')) \times \nabla' G_2(r,r')]$$

where $G_2(r,r')$ is the scalar Green's function for the three-dimensional Helmholtz equation in the medium 2 that satisfies the radiation condition. Hence:

$$\nabla' G_2(r,r') + k_{c,2}^2 G_2(r,r') = \delta(r-r') \tag{55}$$

with $G_2(r,r') = -\frac{1}{4\pi} \frac{e^{-jk_{c,2}|r-r'|}}{|r-r'|}$ and $jk_{c,2} = \sqrt{j\omega\mu_2(\sigma_2 + j\omega\varepsilon_2)}$ Next the equivalent situation is considered where the conductor medium 2 is replaced by that of its surrounding layer (medium 1) and a notional electric surface current J is introduced at the boundary S of the conductor (FIG. 18). The surface current introduces a jump in the tangential magnetic field, while the tangential electric field remains continuous. The superscripts "ext" and "int" are used to denote whether the field components are external Oust outside the boundary S) or internal (Oust inside the boundary S). The boundary conditions at the surface currents are:

$$u_n \times E^{ext}(r) = u_n \times E^{int}(r) \text{ r on S} \tag{56a}$$

$$J_s(r) = u_n \times H^{ext}(r) - u_n \times H^{int}(r) \text{ r on S} \tag{56b}$$

The internal electric and magnetic field components satisfy the same relation (54) as the electric field components, provided that the material properties of the conductor are replaced with the material properties of the background medium. Applying the boundary conditions (56a and 56b), yields the following relation between the external tangential electric and magnetic field components for the equivalent geometry of FIG. 18:

$$u_n \times E(r) = 2u_n \times \int\int_S dS' \left[ -j\omega\mu_1 G_1(r,r')(u'_n \times H(r')) - \right. \tag{57}$$

$$\left. \frac{1}{(\sigma_1 + j\omega\varepsilon_1)} \nabla' G_1(r,r') \nabla' \cdot (u'_n \times H(r')) \right] + 2u_n \times \int\int_S$$

$$dS' \left[ j\omega\mu_1 G_1(r,r') J_s(r') + \frac{1}{(\sigma_1 + j\omega\varepsilon_1)} \nabla' G_1(r,r') \nabla' \cdot J_s(r') \right] +$$

$$2u_n \times \int\int_S dS[(u'_n \times E(r')) \times \nabla' G_1(r,r')]$$

Following the general reasoning previously put forward to define the surface impedance operator, expressions (54) and (57) should constitute identical relations between the tangential electric and magnetic fields on S. Hence the set of boundary integral equations is obtained that determines the three-dimensional surface impedance operator. As in the two-dimensional case, operator notation is introduced and the set of boundary integral equations (54) and (57) is rewritten into a more compact form:

$$Z_1[u_n \times H] = dZ_1[E_t] + Z_t[J_s]$$

$$Z_2[u_n \times H] = dZ_2[E_t] \tag{58}$$

where the three-dimensional boundary integral operators $Z_i[\ ]$ and $dZ_i[\ ]$ (i=1, 2) are defined by:

$$Z_i[F(r)] = u_n \times \int\int_S dS' \left[ j\omega\mu_i G_i(r,r') F(r') + \right. \tag{59}$$

$$\left. \frac{1}{\sigma_i + j\omega\varepsilon_i} \nabla' G_i(r,r') \nabla' \cdot F(r') \right]$$

-continued $$dZ_i[F(r)] = u_n \times \int_C dS'[(u'_n \times F(r')) \times \nabla' G_i(r, r')] - \frac{1}{2}F(r)$$

The surface impedance operator is retrieved by eliminating the magnetic field from expression (58). Using symbolic operator manipulation this yields:

$$E_t(r)=Z_s[J_s(r)]=[Z_2^{-1}dZ_2-Z_1^{-1}dZ_1]^{-1}[J_s(r)] \quad (60)$$

As in the two-dimensional approach it is no longer straightforward to obtain a closed form expression for the surface impedance kernel. Hence more optimal approach is to discretise the boundary integral equations (58) using the same MoM discretisation on the boundary of the conductor as used for solving the external field problem. Elimination of the discretised tangential field yields the discrete surface impedance matrix. In this way there is no need to obtain an explicit expression for the surface impedance kernel, as the discrete surface impedance matrix can be directly integrated in the MoM solution process of the external problem. A general outline of the MoM discretisation process for the external field problem is given above. Here the MoM discretisation process is applied for the internal field problem, to obtain the discretised surface impedance operator.

The boundary S is meshed in a finite number of rectangular or triangular cells. Rooftop basis functions $B_j(r)$ $j=1, \ldots, N$ defined over the cells are used to model the surface current and the tangential field components. Hence, the following discretisations are used:

$$J_s(r) = \sum_{j=1}^{N} I_j B_j(r) \quad (61a)$$

$$E_t(r) = \sum_{j=1}^{N} E_j B_j(r) \quad (61b)$$

$$u_n \times H(r) = \sum_{j=1}^{N} H_j B_j(r) \quad (61c)$$

In these three expressions $I_j$, $E_j$ and $H_j$ are respectively the unknown surface current, tangential electric field and magnetic field amplitudes at the boundary surface.

Applying the MoM discretisation in combination with Galerkin testing to the set of boundary integral equations (58) yields the following set of matrix equations:

$$[Z_1] \cdot [H] = [dZ_1] \cdot [E] + [Z_1] \cdot [I]$$

$$[Z_2] \cdot [H] = [dZ_2] \cdot [E] \quad (62)$$

Using N cells to discretise the boundary S implies that $[Z_1]$, $[dZ_1]$, $[Z_2]$ and $[dZ_2]$ are N'matrices, while $[I]$, $[E]$ and $[H]$ are the N×1 column vectors containing the unknown discrete amplitudes. The elements of the matrices are defined by $$[Z_1]_{ij}=<B_i,Z_1[B_j]> \quad (63)$$

$$[Z_2]_{ij}=<B_i,Z_2[B_j]>$$

$$[dZ_1]_{ij}=<B_i,dZ_1[B_j]>$$

$$[dZ_2]_{ij}=<B_i,dZ_2[B_j]>$$

where $<\cdot,\cdot>$ represents the Galerkin test operator. Elimination of [H] from expression (63) yields the discrete surface impedance matrix for the three-dimensional case $$[E]=[Z_s] \cdot [I]$$

$$\text{with } [Z_s]=[[Z_2]^{-1} \cdot [dZ_2]-[Z_1]^{-1} \cdot [dZ_1]]^{-1} \quad (64)$$

Application of the surface impedance operator for the general case of a 3D conductor embedded in a multilayered medium is straightforward as already described above in relation to expressions (14) and (15). The following generalized mixed potential integral equation, which follows from expression (14), is discretised using MoM:

$$E_t^{in}(r)=j\omega A_t[J_s(r)]+\nabla_t V[q_s(r)]+Z_s[J_s(r)] \quad (65)$$

Figure 19:
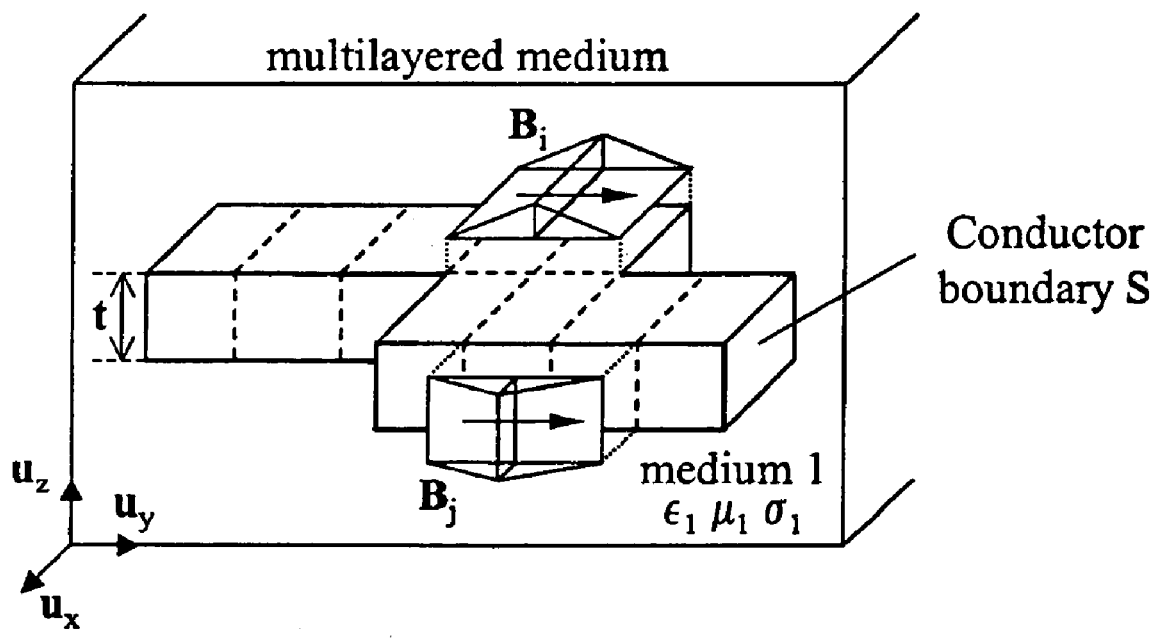
FIG. 19 illustrates discretisation of the notional surface currents on the boundary of the three-dimensional conductor shown in FIG. 17.

The surface S of the 3D conducting object is meshed (FIG. 19) with rectangular and/or triangular cells. The notional surface current $J_s(r)$ is discretised with rooftop basis functions. The amplitude of the surface current follows from the solution of the discrete interaction matrix equation. The tangential electric field in expression (65) is split into three parts associated with the magnetic vector potential, the electric scalar potential and the general surface impedance. In discretised form this yields:

$$[V_{in}]=[V^L]+[V^C]+[V^R] \quad (66)$$

$$\text{with } V_i^L=<B_i,j\omega A_t[J_s(r)]>$$

$$V_i^C=<B_i,\nabla_t V[q_s(r)]>$$

$$V_i^R=<B_i,Z_s[J_s(r)]>$$

The contribution from the general surface impedance can be derived from the discrete surface impedance matrix describing the fields inside the conductor. Using expressions (60) and (61b), this provides $$V_i^R = <B_i, Z_s[J_s(r)]> = <B_i, E_t(r)> = \sum_{j=1}^{N} E_j <B_i, B_j> \quad (67)$$

In matrix notation and using expression (64)

$$[V^R]=[P] \cdot [E]=[P] \cdot [Z_s] \cdot [I] \quad (68a)$$

$$\text{or } [Z^R][P] \cdot [Z_s] \quad (68b)$$

where the projection matrix [P] has been introduced with elements $$P_{i,j}=<B_i,B_j> \quad (69)$$

Expression (68b) is the generalized form of the resistive (third) term in expression (13), describing the contribution of the fields inside the thick conductor in terms of the generalized surface impedance operator acting on the equivalent surface currents. In the generalized form (68b) the discrete resistive matrix is given by the matrix product of the projection matrix and the general surface impedance matrix that follows from the solution of the internal field problem. This novel formulation is a generalization of expression (13), which gives the discrete resistive matrix as the product of the projection matrix and the scalar surface impedance.

Thus the general surface impedance concept enables modelling of a 3D conducting object in a multilayered medium by notionally replacing the conductor with the background medium and introducing a notional surface current at the boundary of the conductor. This enables the continuous nature of the planar stratified background medium to be restored and the solution process of the planar EM solver to be retained for the external field problem. The Green's functions $G^A(r,r')$ and $G^V(r,r')$ of the multilayered medium can still be used without modification. The effects of the fields inside the conductor are represented by the discrete surface impedance matrix, which follows from expression (64) and fits seamlessly in the discrete interaction matrix equation for solving the external field problem.

What is claimed is:

1. A method of modelling current flows in a body in three-dimensions embedded in a medium composed of a first material, the body being composed of a second material, comprising:

defining a plurality of planar surfaces that together surround and include the body;
 deriving a value for surface admittance of the plurality of planar surfaces; and
 modelling current flows in the body in terms of surface currents induced on the planar surfaces of the body composed of the first material and having the derived value for surface admittance wherein a value for surface admittance is derived in accordance with the expression $$u_n \times J_s(r) = u_n \times Y_s[E(r)] = u_n \times \int\int_S dS' \overline{\overline{Y}}_s(r,r') \cdot E(r')$$

where $u_n$ is the unit vector normal to the planar surface, $E(r)$ is the electric field at the surface, $J_s(r)$ is the induced surface current at the surface, $Y_s[\ ]$ is the surface admittance operator that relates the electric field with the induced surface current at the surface and $Y_s$ with two overbars is the integral kernel in the boundary surface integral representation of the surface admittance operator.

2. The method of claim 1, wherein the body is composed of an electrically conductive material.

3. The method of claim 1, wherein the body is composed of a dielectric material.

4. The method of claim 1, wherein the medium is composed of a stack of different dielectric material layers.

5. The method of claim 1, further comprising obtaining a discrete representation of the surface admittance operator for a one-dimensional approximation of the body in accordance with the expression $$\begin{bmatrix} E_1 \\ E_2 \end{bmatrix} = \begin{bmatrix} Z_{s,s} & Z_{s,m} \\ Z_{s,m} & Z_{s,s} \end{bmatrix} \cdot \begin{bmatrix} J_{s,1} \\ J_{s,2} \end{bmatrix}$$

with $$Z_{s,s} = \frac{1}{2}(Z_1 + Z_2)$$

$$Z_{s,m} = \frac{1}{2}(Z_1 - Z_2)$$

and $$Z_1 = \frac{Z_{c,1} Z_{c,2}}{Z_{c,1} \tanh\left(jk_{c,2}\frac{t}{2}\right) - Z_{c,2} \tanh\left(jk_{c,1}\frac{t}{2}\right)}$$

-continued $$Z_2 = \frac{Z_{c,1} Z_{c,2}}{Z_{c,1} \coth\left(jk_{c,2}\frac{t}{2}\right) - Z_{c,2} \coth\left(jk_{c,1}\frac{t}{2}\right)}$$

where t is the thickness of the one-dimensional approximation of the body, $Z_{c,i}$ is the characteristic impedance and $k_{c,i}$ is the characteristic propagation constant for plane wave propagation in the medium i.

6. The method of claim 1, further comprising obtaining a discrete representation of the surface admittance operator for a two-dimensional approximation of the body in accordance with the expression $[E]=[Z_s]\cdot[I]$ with $[Z_s]=[[Z_2]^{-1}\cdot[dZ_2]-[Z_1]^{-1}\cdot[dZ_1]]^{-1}$ where [E] represents the column vector of the discrete electric field coefficients and [I] represents the column vector of the discrete surface current coefficients.

7. The method of claim 1, further comprising obtaining a discrete representation of the surface admittance operator for a three-dimensional representation of the body in accordance with the expression $[E]=[Z_s]\cdot[I]$ with $[Z_s]=[[Z_2]^{-1}\cdot[dZ_2]-[Z_1]^{-1}\cdot[dZ_1]]^{-1}$.

8. Apparatus for modelling current flows in a body in three dimensions embedded in a medium composed of a first material, the body being composed of a second material, comprising:

a store arranged to hold data defining a plurality of planar surfaces that together surround and include the body; and
 a processor arranged to derive a value for surface admittance of the plurality of planar surfaces, and to model current flows in the body in terms of surface currents induced on the planar surfaces of the body composed of the first material and having the derived value for surface admittance, wherein the processor derives the value for surface admittance in accordance with the expression $$u_n \times J_S(r) = u_n \times Y_S[E(r)] = u_n \times \int\int_S dS' \overline{\overline{Y}}_S(r,r') \cdot E(r')$$

where $u_n$ is the unit vector normal to the planar surface, $E(r)$ is the electric field at the surface, $J_s(r)$ is the induced surface current at the surface, $Y_s[\ ]$ is the surface admittance operator that relates the electric field with the induced surface current at the surface and $Y_s$ with two overbars is the integral kernel in the boundary surface integral representation of the surface admittance operator.

* * * * *

UNITED STATES PATENT AND TRADEMARK OFFICE
CERTIFICATE OF CORRECTION

PATENT NO. : 7,331,023 B2  Page 1 of 1
APPLICATION NO. : 11/069545
DATED : February 12, 2008
INVENTOR(S) : Sercu et al.

It is certified that error appears in the above-identified patent and that said Letters Patent is hereby corrected as shown below:

On the title page, item (56), under "Other Publications", in column 2, line 4, delete "medhod," and insert -- method, --, therefor.

Signed and Sealed this

Tenth Day of June, 2008

JON W. DUDAS
*Director of the United States Patent and Trademark Office*